(12) United States Patent
Kajigaya et al.

(10) Patent No.: US 9,196,351 B2
(45) Date of Patent: Nov. 24, 2015

(54) DEVICE INCLUDING A PLURALITY OF MEMORY BANKS AND A PIPELINE CONTROL CIRCUIT CONFIGURED TO EXECUTE A COMMAND ON THE PLURALITY OF MEMORY BANKS

(71) Applicant: PS4 Luxco S.a.r.l, Luxembourg (LU)

(72) Inventors: Kazuhiko Kajigaya, Tokyo (JP); Tomonori Sekiguchi, London (GB); Kazuo Ono, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/177,210

(22) Filed: Feb. 10, 2014

(65) Prior Publication Data

US 2014/0169111 A1    Jun. 19, 2014

Related U.S. Application Data

(63) Continuation of application No. 12/929,126, filed on Jan. 3, 2011, now Pat. No. 8,675,419.

(30) Foreign Application Priority Data

Jan. 7, 2010    (JP) .................. 2010-001981

(51) Int. Cl.
| | |
|---|---|
| G11C 7/00 | (2006.01) |
| G11C 11/409 | (2006.01) |
| G11C 5/02 | (2006.01) |
| G11C 5/06 | (2006.01) |
| G11C 7/10 | (2006.01) |
| G11C 7/18 | (2006.01) |
| G11C 11/4076 | (2006.01) |

(52) U.S. Cl.
CPC ............... *G11C 11/409* (2013.01); *G11C 5/02* (2013.01); *G11C 5/06* (2013.01); *G11C 7/1039* (2013.01); *G11C 7/18* (2013.01); *G11C 11/4076* (2013.01)

(58) Field of Classification Search
None
See application file for complete search history.

(56) References Cited

U.S. PATENT DOCUMENTS

| | | | |
|---|---|---|---|
| 5,060,145 A | 10/1991 | Scheuneman et al. | |
| 5,912,847 A | 6/1999 | Tamaki | |
| 6,061,294 A | 5/2000 | Koshikawa | |

(Continued)

FOREIGN PATENT DOCUMENTS

| | | |
|---|---|---|
| JP | H08-129887 A | 5/1996 |
| JP | H11-45567 A | 2/1999 |

(Continued)

OTHER PUBLICATIONS

Japanese Office Action dated Dec. 17, 2013.

(Continued)

*Primary Examiner* — Kretelia Graham
(74) *Attorney, Agent, or Firm* — Kunzler Law Group, PC

(57) ABSTRACT

A method for carrying out read and write operations in a synchronous memory device having a shared I/O, includes receiving a read command directed to a first internal memory bank during a first timeslot, activating the first internal memory bank to access read data at a read address requested by the read command, receiving a write command directed to a second internal memory bank during a second timeslot later than the first timeslot, determining whether a data collision between the read data for output to the shared I/O with normal read latency and write data to be received on the shared I/O with normal write latency would occur, and receiving the write data on the shared I/O with the normal write latency during a third timeslot later than the second timeslot.

14 Claims, 25 Drawing Sheets

(56) References Cited

U.S. PATENT DOCUMENTS

| | | |
|---|---|---|
| 6,134,178 A | 10/2000 | Yamazaki et al. |
| 6,314,044 B1 | 11/2001 | Sasaki et al. |
| 7,246,215 B2 | 7/2007 | Lu et al. |
| 2002/0018394 A1 | 2/2002 | Takahashi |

FOREIGN PATENT DOCUMENTS

| | | |
|---|---|---|
| JP | H11-110964 A | 4/1999 |
| JP | 2000-048566 A | 2/2000 |
| JP | 2002-056676 A | 2/2002 |

OTHER PUBLICATIONS

Vignon, et al., "A Noel DRAM Architecture as a Low Leakage Alternative for SRAM Caches in a 3D Interconnect Context", Design, Automation & Test in Europe Conference & Exhibition, Apr. 20-24, 2009, pp. 929-933.

Somasekhar, et al., "2GHz2Mb 2T Gain-Cell Memory Macro with 128GB/s Bandwidth in a 65nm Logic Process" Solid-State Circuits Conference 2008 (ISSCC 2008), Session 14, Embedded & Graphics DRAMs/14.3, Digest of Technical Papers, pp. 7274-7275, 613, Feb. 5, 2008.

FIG. 5

|   | A | B | C |
|---|---|---|---|
| 0 | DQ0T | DQ0B | BA0 |
|   | DQ1T | DQ1B | BA1 |
|   | DQ2T | DQ2B | A0 |
|   | DQ3T | DQ3B | A1 |
|   | DQ4T | DQ4B | A2 |
|   | DQ5T | DQ5B | A3 |
|   | DQ6T | DQ6B | A4 |
|   | DQ7T | DQ7B | A5 |
|   | DQM0T | DQM0B | A6 |
|   | DQS0T | DQS0B | A7 |
|   | VDDQ | VSSQ | A8 |
|   | DQ8T | DQ8B | A9 |
|   | DQ9T | DQ9B | A10 |
|   | DQ10T | DQ10B | A11 |
|   | DQ11T | DQ11B | A12 |
|   | DQ12T | DQ12B | A13 |
|   | DQ13T | DQ13B | A14 |
|   | DQ14T | DQ14B | A15 |
|   | DQ15T | DQ15B | A16 |
|   | DQM1T | DQM1B | A17 |
|   | DQS1T | DQS1B | A18 |
|   | VDDQ | VSSQ | A19 |
|   | DQ16T | DQ16B | A20 |
|   | DQ17T | DQ17B | CSB |
|   | DQ18T | DQ18B | RASB |
|   | DQ19T | DQ19B | CASB |
|   | DQ20T | DQ20B | WEB |
|   | DQ21T | DQ21B | RESETB |
|   | DQ22T | DQ22B |  |
|   | DQ23T | DQ23B |  |
|   | DQM2T | DQM2B |  |
|   | DQS2T | DQS2B |  |
|   | VDDQ | VSSQ |  |
|   | DQ24T | DQ24B |  |
|   | DQ25T | DQ25B |  |
|   | DQ26T | DQ26B |  |
|   | DQ27T | DQ27B |  |
|   | DQ28T | DQ28B |  |
|   | DQ29T | DQ29B |  |
|   | DQ30T | DQ30B |  |
|   | DQ31T | DQ31B |  |
|   | DQM3T | DQM3B |  |
|   | DQS3T | DQS3B |  |
| 43 | VDDQ | VSSQ |  |

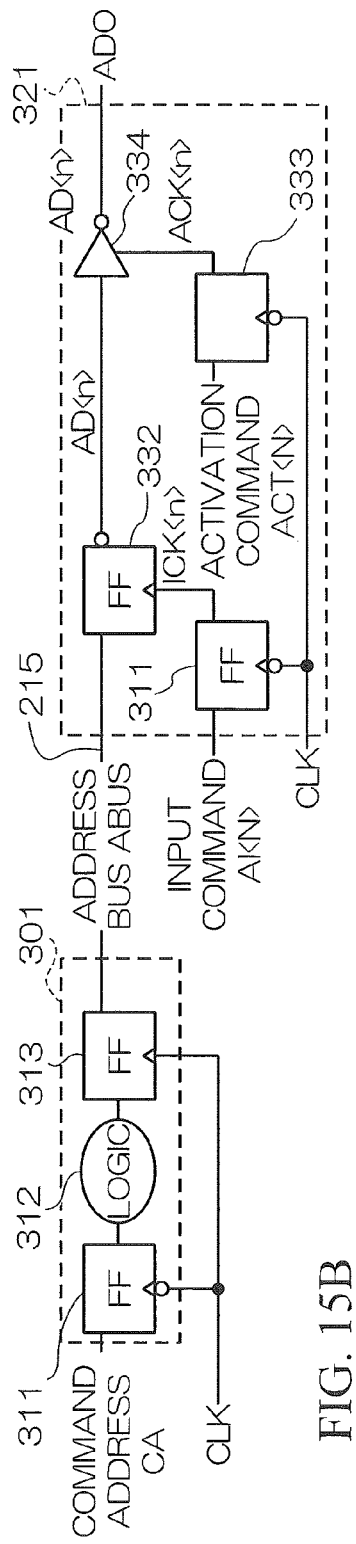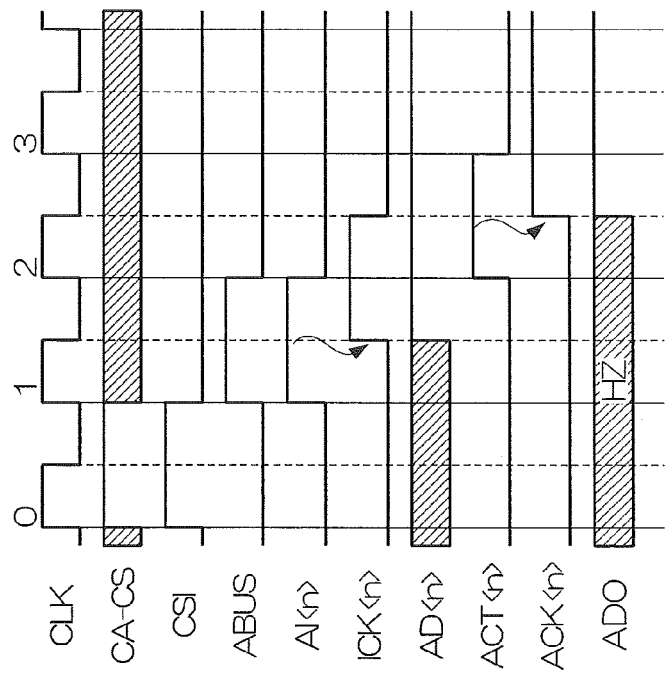
FIG. 15A
FIG. 15B

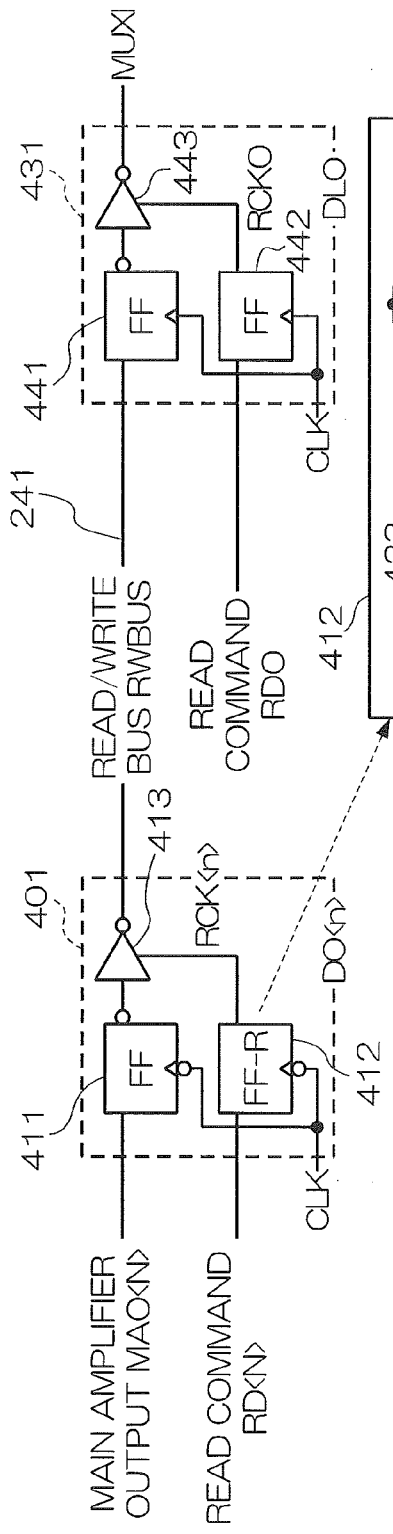
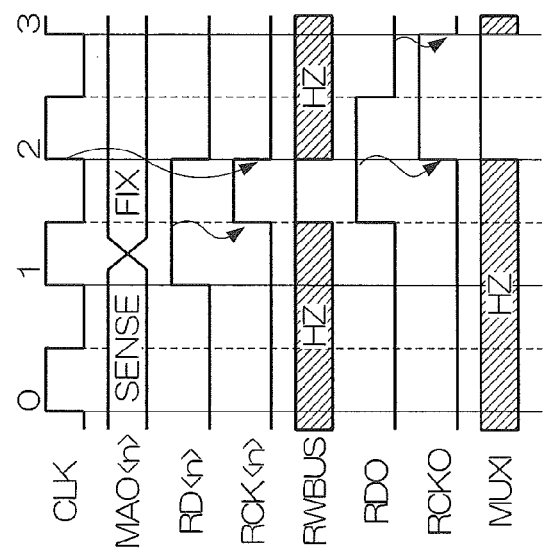
FIG. 16A
FIG. 16B

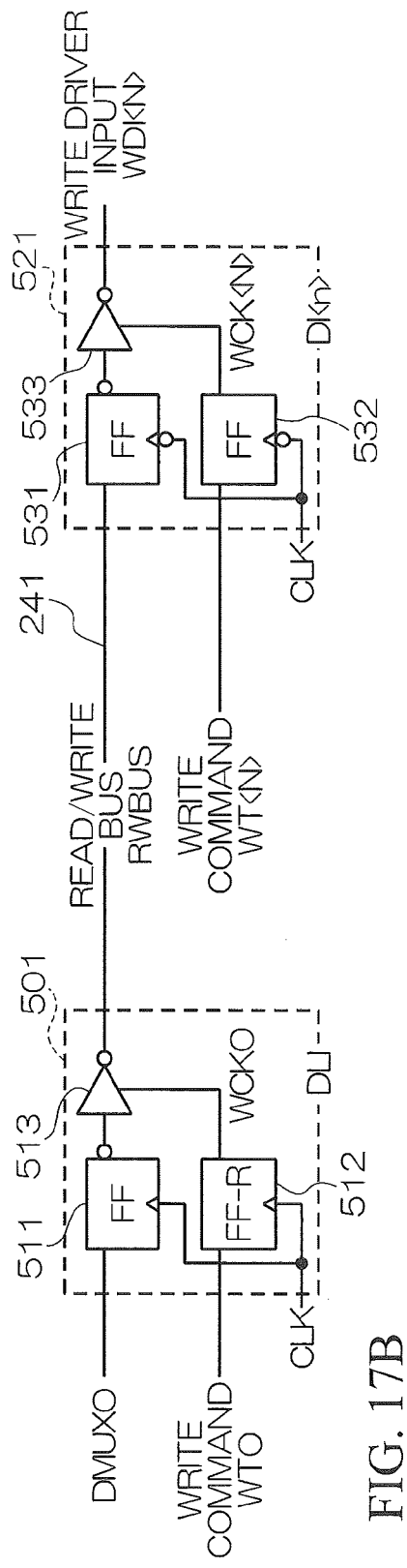
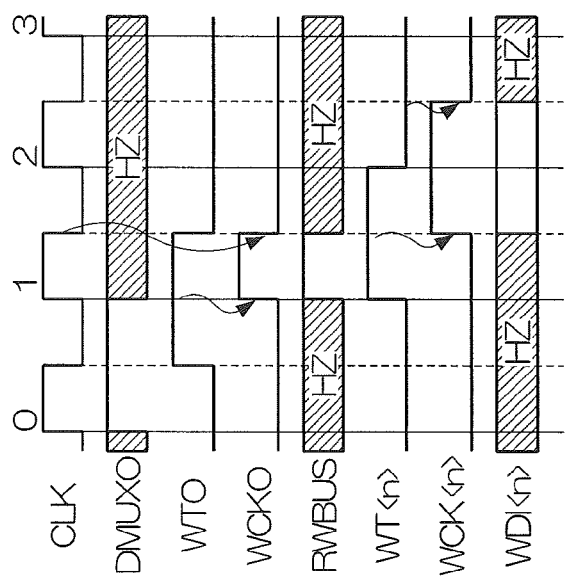
FIG. 17A
FIG. 17B

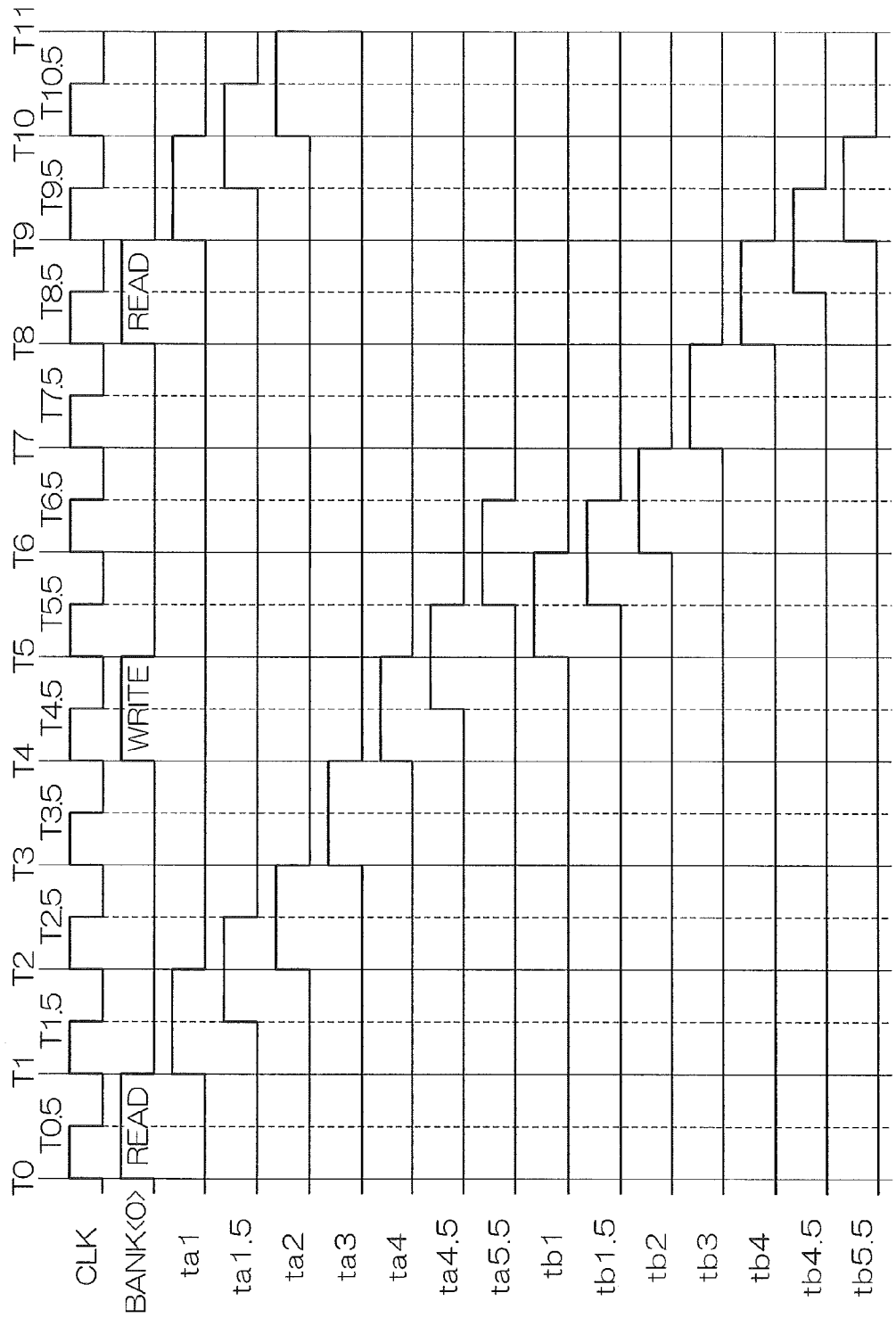

DEVICE INCLUDING A PLURALITY OF MEMORY BANKS AND A PIPELINE CONTROL CIRCUIT CONFIGURED TO EXECUTE A COMMAND ON THE PLURALITY OF MEMORY BANKS

This application is a Continuation application of U.S. patent application Ser. No. 12/929,126, filed on Jan. 3, 2011, which is incorporated herein by reference.

BACKGROUND OF THE INVENTION

1. Field of the Invention

The present invention relates to a semiconductor device suitable for use as a dynamic random access memory (DRAM) stacked with a multi-core central processing unit (CPU) or the like, and a control method thereof.

Priority is claimed on Japanese Patent Application No. 2010-1981, filed Jan. 7, 2010, the content of which is incorporated herein by reference.

2. Description of the Related Art

A technique is proposed to implement high speed by dividing a DRAM array so as to use the DRAM three-dimensionally (3D) stacked with a CPU as a cache. This technique is disposed by A. Vignon, S. Cosemans, W. Dehaene, P. Marchal and M. Facchini, in "A novel DRAM architecture as a low leakage alternative for SRAM caches in a 3D interconnect context," Design, Automation & Test in Europe Conference & Exhibition, 2009. DATE '09. 20-24 Apr. 2009, pp. 929-933.

A pipelined operation using a two-transistor (2T) type DRAM is proposed as a method of improving a DRAM operation cycle suitable for the 3D stack or the like. This operation is disclosed by SOMASEKHAR Dinesh, Y E Yibin, ASERON Paolo, L U Shih-Lien, KHELLAH Muhammad, HOWARD Jason, RUHL Greg, KARNIK Tanay, BORKAR Shekhar, D E Vivek, KESHAVARZI Ali, in "2 GHz 2 Mb 2T Gain-Cell Memory Macro With 128 GB/s Bandwidth in a 65 nm Logic Process," Solid-State Circuits Conference 2008 (ISSCC 2008), SESSION 14, EMBEDDED & GRAPHOCS DRAMs/14.3, Digest of Technical Papers, pp. 274-275, Feb. 5, 2008. A DRAM macro disclosed in Non-patent Document 2 is constituted as a 2 Mb macro using eight 256 Kb (bit) arrays in which an independent operation is performed. Here, the DRAM macro is a functional block integrated in a type in which a DRAM circuit function can be combined with other circuit functions. Input/output (I/O) has a configuration of 8×64×2=1 K, and a 1-array configuration is 128 Rows×4 Columns×64 I/O×8 Banks. A random cycle is 4 ns=8 clocks, and a 4-stage pipeline operation in which 2 banks of the 8 banks are used for each stage is performed. A read/write separation bus is used.

SUMMARY

In one embodiment, a semiconductor device may include, but is not limited to, a delay buffer, and a pipeline control circuit. The pipeline control circuit controls the delay buffer to hold read data from outputting to a read/write bus for each of banks based on a read command to the each bank while the pipeline control circuit controlling the delay buffer to output write data to the read/write bus, when a next command to the each bank is a write command for the write data. The read/write bus is common to the banks.

In another embodiment, a semiconductor device may include, but is not limited to, a plurality of memory cores on a single semiconductor chip. Each of the memory cores performing read/write operations independently from read/write operations of remaining one or ones of the memory cores. Each of the memory cores may include, but is not limited to, a plurality of memory banks. Each of the memory banks of each of the memory cores may include, but is not limited to, a memory cell array including a plurality of memory cells, an address buffer receiving a set of address signals; a data output buffer, and a data input buffer. Each of the memory cores may further include, but is not limited to, a control circuit selecting one or ones of the memory cells in response to the set of address signals supplied from the address buffer so that the one or ones of the memory cell supplies, when the each of the banks performs a data read operation, a read data to the data output buffer and so that the data input buffer supplies, when the each of the banks performs a data write operation, a write data to the one or ones of the memory cells. Each of the memory banks performs one of the data read operation and the data write operation during one of a plurality of access cycles, data read and data write operations that are performed by the memory banks during the one of the access cycles are pipelined so that the access cycles sequentially performed.

In still another embodiment, a semiconductor device may include, but is not limited to, a plurality of memory cores on a single semiconductor chip. Each memory core may include, but is not limited to, a plurality of memory banks; a plurality of address terminals receiving a plurality sets of address signals. Each of the memory cores performs read/write operations independently from read/write operations of remaining one or ones of the memory cores. The memory banks of each of the memory cores perform respectively data read/write operations that are pipelined. Each of the memory bands of each of the memory cores performs one of the data read/write operations in response to an associated one of the sets of address signals.

BRIEF DESCRIPTION OF THE DRAWINGS

The above features and advantages of the present invention will be more apparent from the following description of certain preferred embodiments taken in conjunction with the accompanying drawings, in which:

FIG. 5 is a diagram illustrating a layout of pins of the DRAM core shown in FIG. 4;

FIG. 15A is a block diagram illustrating configurations of command address bus of the DRAM core shown in FIG. 11;

FIG. 15B is a timing chart illustrating timings of operations of command address bus of the DRAM core shown in FIG. 11;

FIG. 16A is a block diagram illustrating configurations of circuits associated with read operation of the DRAM core shown in FIG. 11;

FIG. 16B is a timing chart illustrating timings of read operations of the circuits associated with the read operation of the DRAM core shown in FIG. 11;

FIG. 17A is a block diagram illustrating configurations of circuits associated with write operation of the DRAM core shown in FIG. 11;

FIG. 17B is a timing chart illustrating timings of write operations of the circuits associated with the write operation of the DRAM core shown in FIG. 11;

FIG. 21 is a timing chart illustrating a first half of timings of other operations of the pipeline control circuit shown in FIG. 19;

DETAILED DESCRIPTION OF THE PREFERRED EMBODIMENTS

Before describing the present invention, the related art will be explained in detail with reference to FIGS. 23A, 23B, 24 and 25, in order to facilitate the understanding of the present invention.

In the above-described configuration, the pipelined operation is performed in the 8-bank/4-stage pipeline, and the same address is used for all the banks in the read operation, and an independent address is used for each bank in the write operation, so as to avoid a collision in an address bus. As shown in the timing charts of FIGS. 23A and 23B, the read operation in each bank is immediately performed upon receipt of a command R (FIG. 23A), but the write operation is performed after waiting for 8 cycles upon receipt of a command W (FIG. 23B). In the read operation, since stages of the pipeline are respectively shifted by 1 cycle and activated, data is output in 2 cycles from each stage to fill the pipeline.

Figure 23A:
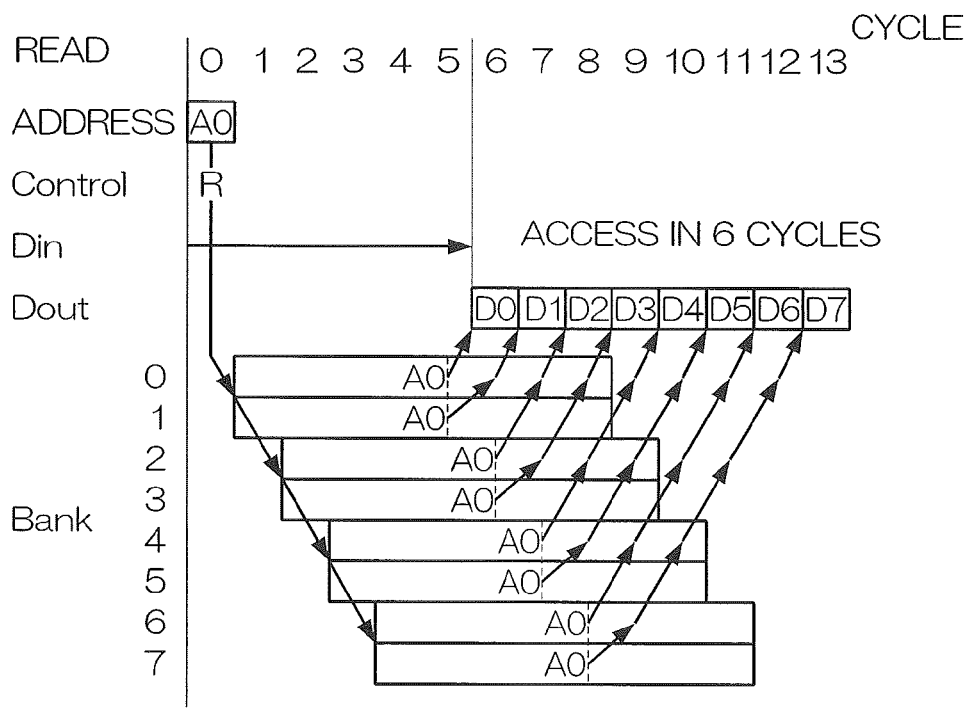
FIG. 23A is a timing chart illustrating timings of operations of a semiconductor device in the related art.
Figure 23B:
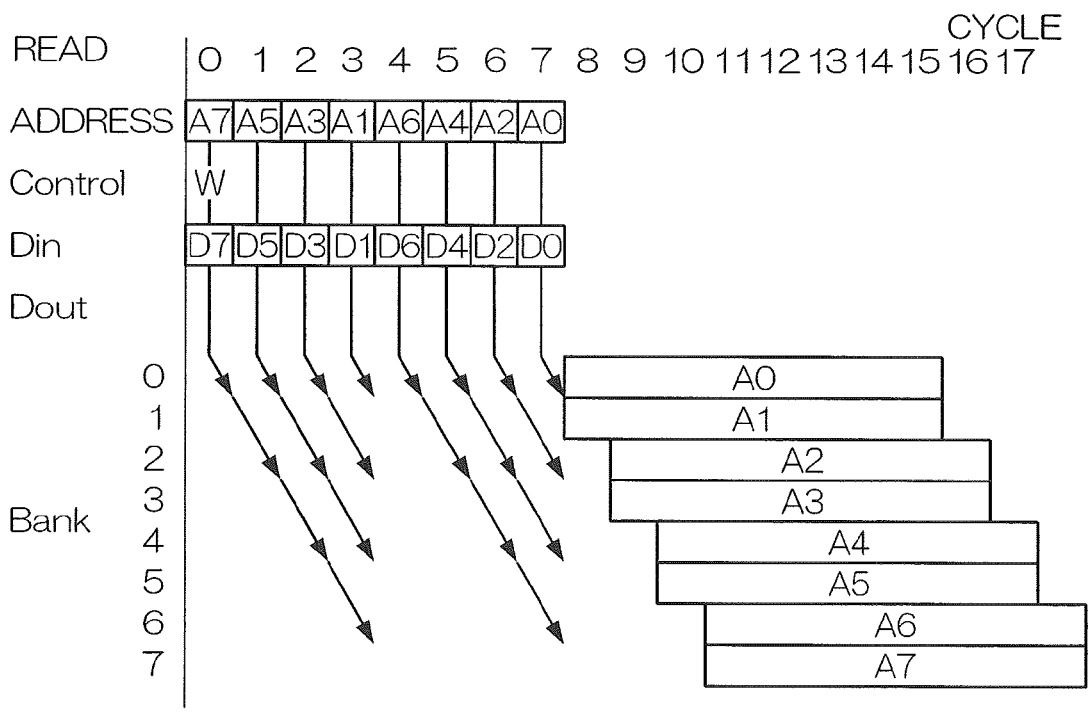
FIG. 23B is a timing chart illustrating timings of operations of a semiconductor device in the related art.

In the timing chart of the read operation shown in FIG. 23A, an address, a control command (Control), input data (Din), output data (Dout), and access timings to banks 0 to 7 are shown in cycles 0 to 13 of an operation clock. Here, A0 is a read address for the banks 0 to 7, and D0 to D7 denote read data from the banks 0 to 7. In the timing chart of the write operation shown in FIG. 23B, an address, a control command (Control), input data (Din), output data (Dout), and access timings to the banks 0 to 7 in cycles 0 to 17 of an operation clock are shown. A0 to A7 are write addresses to the banks 0 to 7, and D0 to D7 are write data directed to the banks 0 to 7.

In the read operation as shown in FIG. 23A, the common address A0 is input to all the banks, and the data D0 to D7 are read from the banks 0 to 7 in this order. On the other hand, in the write operation as shown in FIG. 23B, an individual address for each bank is input. In this regard, the banks 0 to 7 are accessed in order of the bank 7, the bank 5, the bank 3, the bank 1, the bank 6, the bank 4, the bank 2, and the bank 0.

In the configurations as shown in FIGS. 23A and 23B described above, there is a problem in that usability is bad since the common address is used for all the banks in the read operation and an address input method is different between the read and write operations. Since an order of data I/O is different, there is a problem in that use is difficult. Also, if the write operation is performed immediately after the read operation, it is necessary to perform write processing after read data is output so as to avoid a data collision in the data bus and a bubble occurs in processing of the pipeline. Thus, there is a problem in that an effective data rate (average data rate) of a system is degraded.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a delay buffer, and a pipeline control circuit. The pipeline control circuit controls the delay buffer to hold read data from outputting to a read/write bus for each of banks based on a read command to the each bank while the pipeline control circuit controlling the delay buffer to output write data to the read/write bus, when a next command to the each bank is a write command for the write data. The read/write bus is common to the banks.

In some cases, the read/write bus may be connected in time-division to the each bank in pipeline operation.

In some cases, the each bank may be connected to the read/write bus in response to a clock signal.

In some cases, the semiconductor device may include, but is not limited to, an address delay circuit that delays, by a write latency, transfer of a read address on an address bus that is connected to the each bank.

In some cases, an address setup time before a read operation may be equal to a sum of an address setup time before a write operation and a stand-by time for access to the same bank to which the write operation is performed.

In some cases, the pipeline control circuit may include, but is not limited to, a pair of command registers that alternately store read and write commands to the each bank. The pipeline control circuit controls delay operation of the delay buffer based on a first signal indicating whether the delay buffer is holding the read data and based on contents stored in the pair of command registers.

In some cases, the pipeline control circuit may control delay operation of the delay buffer by using a result of logic operation of a plurality of control signals, the first signal, and a control signal. Each of the plurality of control signals indicates a time elapsed since an input of command into the each bank. The time is represented based on the clock signal. The first signal indicates whether the delay buffer is holding the read data. The control signal represents the contents stored in the pair of command registers.

In some cases, the read/write bus may be used to transfer write data in a first half of the clock signal and to transfer read data in a second half of the clock signal.

In some cases, the semiconductor device may include, but is not limited to, a memory chip, and a CPU chip. The CPU chip is stacked on the memory chip. The memory chip may include, but is not limited to, a plurality of memory cores. Each of the memory cores may include, but is not limited to, the banks. The CPU chip may include, but is not limited to, a plurality of CPU cores.

In some cases, the semiconductor device may include, but is not limited to, a command address input circuit, a data input/output circuit, and latch circuits. The command address input circuit receives inputs of the command and the address. The data input/output circuit performs input and output of data into and from the read/write bus. Latch circuits are controlled by the clock signal. The latch circuits separate among the command address input circuit, the address bus, the each bank, the read/write bus, and the data input/output circuit.

In some cases, the latch circuit separating between the read/write bus, and the data input/output circuit may include, but is not limited to, the delay buffer in the each bank, an output latch that holds the read data, and a write latch that holds the write data.

In some cases, the address bus may be used to simultaneously supply a row address and a column address to the each bank.

In some cases, the semiconductor device may include, but is not limited to, a multiplexer, and a demultiplexer. The multiplexer and the demultiplexer are disposed between the read/write bus and the data input/output circuit.

In some cases, data is transferred between the memory core and the CPU core in synchronous with a read/write clock signal. The read/write clock signal is shorter in cycle than the clock signal.

In some cases, the memory chip may have the same number of the memory cores as the CPU cores included in the CPU chip. The memory cores are positioned in correspondence to the CPU cores.

In another embodiment, a semiconductor device may include, but is not limited to, a plurality of memory cores on a single semiconductor chip. Each of the memory cores performing read/write operations independently from read/write operations of remaining one or ones of the memory cores. Each of the memory cores may include, but is not limited to, a plurality of memory banks. Each of the memory banks of each of the memory cores may include, but is not limited to, a memory cell array including a plurality of memory cells, an address buffer receiving a set of address signals; a data output buffer, and a data input buffer. Each of the memory cores may further include, but is not limited to, a control circuit selecting one or ones of the memory cells in response to the set of address signals supplied from the address buffer so that the one or ones of the memory cell supplies, when the each of the banks performs a data read operation, a read data to the data output buffer and so that the data input buffer supplies, when the each of the banks performs a data write operation, a write data to the one or ones of the memory cells. Each of the memory banks performs one of the data read operation and the data write operation during one of a plurality of access cycles, data read and data write operations that are performed by the memory banks during the one of the access cycles are pipelined so that the access cycles sequentially performed.

In some cases, each of the memory cores may further include, but is not limited to, a plurality of command terminals; a plurality of address terminals receiving a plurality of sets of the address signals; a plurality of data terminals; a command decoder that decodes commands to generate control signals, the commands having been supplied from the plurality of command terminals; an address bus coupled in common to the memory banks, the address bus transferring the sets of address signals supplied from the plurality of address terminals; and a data read/write bus coupled in common to the memory banks, the data read/write bus transferring the read data to the data terminals when the each of the memory cores performs a read operation, the data read/write bus transferring the write data from the data terminals when the each of the memory cores performs a write operation.

In some cases, the address buffer of the each of the memory banks of the memory cores fetches a corresponding one of the sets of address signals supplied from the address bus in response to the control signals that are generated by the command decoder. The data output buffer of the each of the memory banks of the memory cores holds the read data on the data read/write bus when the each of the memory cores performs the read operation. The data input buffer of the each of the memory banks of the memory cores holds the write data on the data read/write bus when the each of the memory cores performs a write operation.

In some cases, each of the memory cores including a plurality of delay buffers each provided for a corresponding one of the memory banks. Each of the delay buffers holds the read data during a period of time and output the read data when one of the access cycles includes the data read operation performed for one of the banks and another one of the access cycles following the one of the access cycles includes the data write operation performed on the one of the banks.

In still another embodiment, a semiconductor device may include, but is not limited to, a plurality of memory cores on a single semiconductor chip. Each memory core may include, but is not limited to, a plurality of memory banks; a plurality of address terminals receiving a plurality sets of address signals. Each of the memory cores performs read/write operations independently from read/write operations of remaining one or ones of the memory cores. The memory banks of each of the memory cores perform respectively data read/write operations that are pipelined. Each of the memory bands of each of the memory cores performs one of the data read/write operations in response to an associated one of the sets of address signals.

Figure 1A:
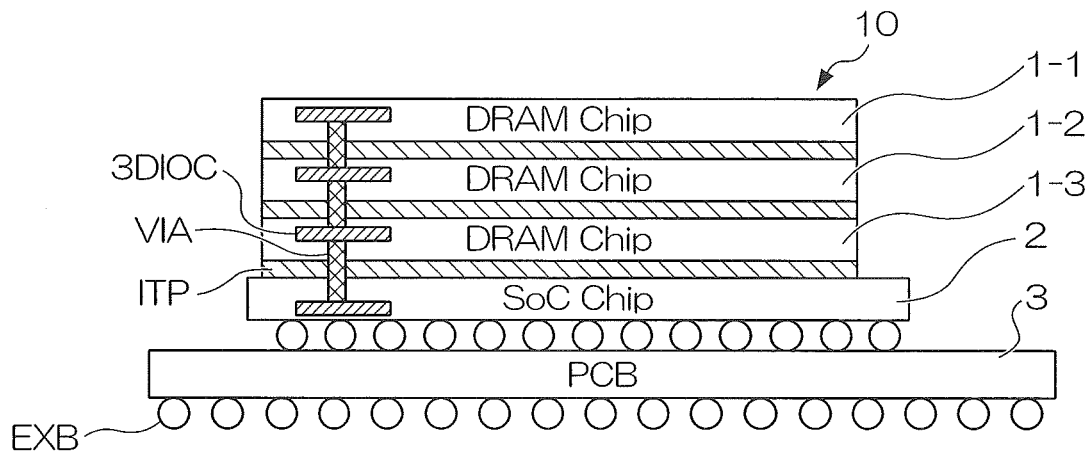
FIG. 1A is a cross sectional elevation view illustrating a semiconductor package including a printed circuit board on which an SoC chip and DRAM chips are stacked in accordance with a preferred embodiment of the present invention.
Figure 1B:
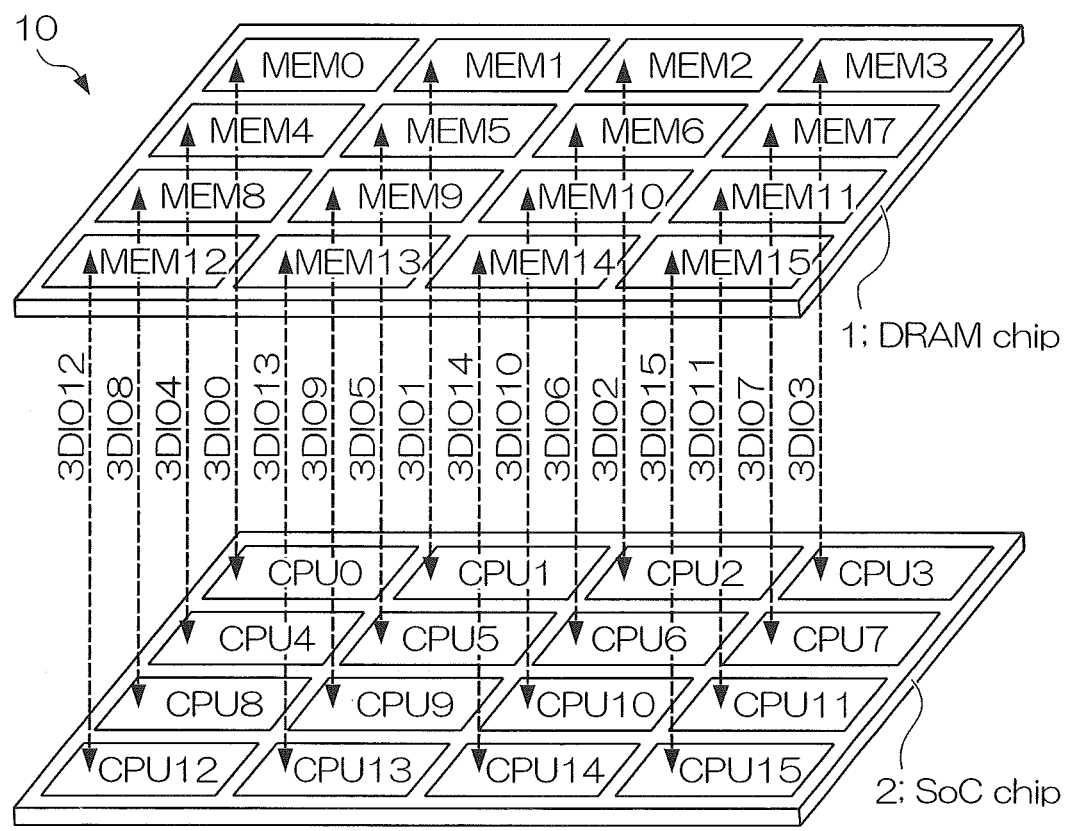
FIG. 1B is a schematic perspective view illustrating the SoC chip and the DRAM chip shown in FIG. 1A.

Illustrative embodiments of the present invention will now be described with reference to the drawings. FIGS. 1A and 1B are schematic diagrams showing the configuration of the semiconductor device 10 as an embodiment of the present invention. FIG. 1A is a side view schematically showing a cross-sectional structure of the semiconductor device 10, and FIG. 1B is a perspective view schematically showing a signal connection relationship between one of DRAM chips 1-1 to 1-3 (shown as a DRAM chip 1) and an SoC chip 2. The same elements are denoted by the same reference numerals in the figures.

The semiconductor device 10 of this embodiment shown in FIG. 1A has a structure in which the DRAM chips 1-1 to 1-3 of a multi-core configuration are stacked on the SoC chip or CPU chip 2 of a multi-core configuration. In this case, the DRAM chips 1-1 to 1-3 are electrically connected to the SoC chip 2 by a connection between I/O circuits (3D I/O circuits) 3DIOC within chips using a through via VIA. I/O pins serving as I/O terminals of signal lines and the like connected between the DRAM chips 1-1 to 1-3 and the SoC chip 2 can be arranged in the I/O circuits 3DIOC within the DRAM chips 1-1 to 1-3 and the SoC chip 2. Accordingly, 100 or more I/O pins can be provided for each core of the DRAM chips 1-1 to 1-3 and the SoC chip 2. The DRAM chips 1-1 to 1-3 and the SoC chip 2 are stacked by inserting only interposers ITP, so that distances therebetween are also close and a transmission frequency can be increased. Accordingly, it is possible to improve a data transmission rate between CPU cores within the SoC chip 2 and DRAM cores within the DRAM chips 1-1 to 1-3 by implementing the stack structure as described above. In this case, the SoC chip 2 is soldered onto a board PCB 3 and solder bumps EXB are formed on the board PCB 3.

In this embodiment as shown in FIG. 1B, 16 DRAM cores MEM0 to MEM15 are mounted on the DRAM chip 1 (corresponding to the DRAM chips 1-1 to 1-3) in a 4×4 two-dimensional arrangement. Also, 16 CPU cores CPU0 to CPU15 are mounted on the SoC chip 2 in a 4×4 two-dimensional arrangement. The number of DRAM cores MEM0 to MEM15 is the same as the number of CPU cores CPU0 to CPU15. The DRAM cores MEM0 to MEM15 and the CPU cores CPU0 to CPU15 are arranged in positions corresponding to each other in a vertical direction on the chips, and are connected to each other by 3D I/O (configurations including both of I/O lines and I/O pins (I/O terminals)) 3DIO0 to 3DIO15.

Figure 2:
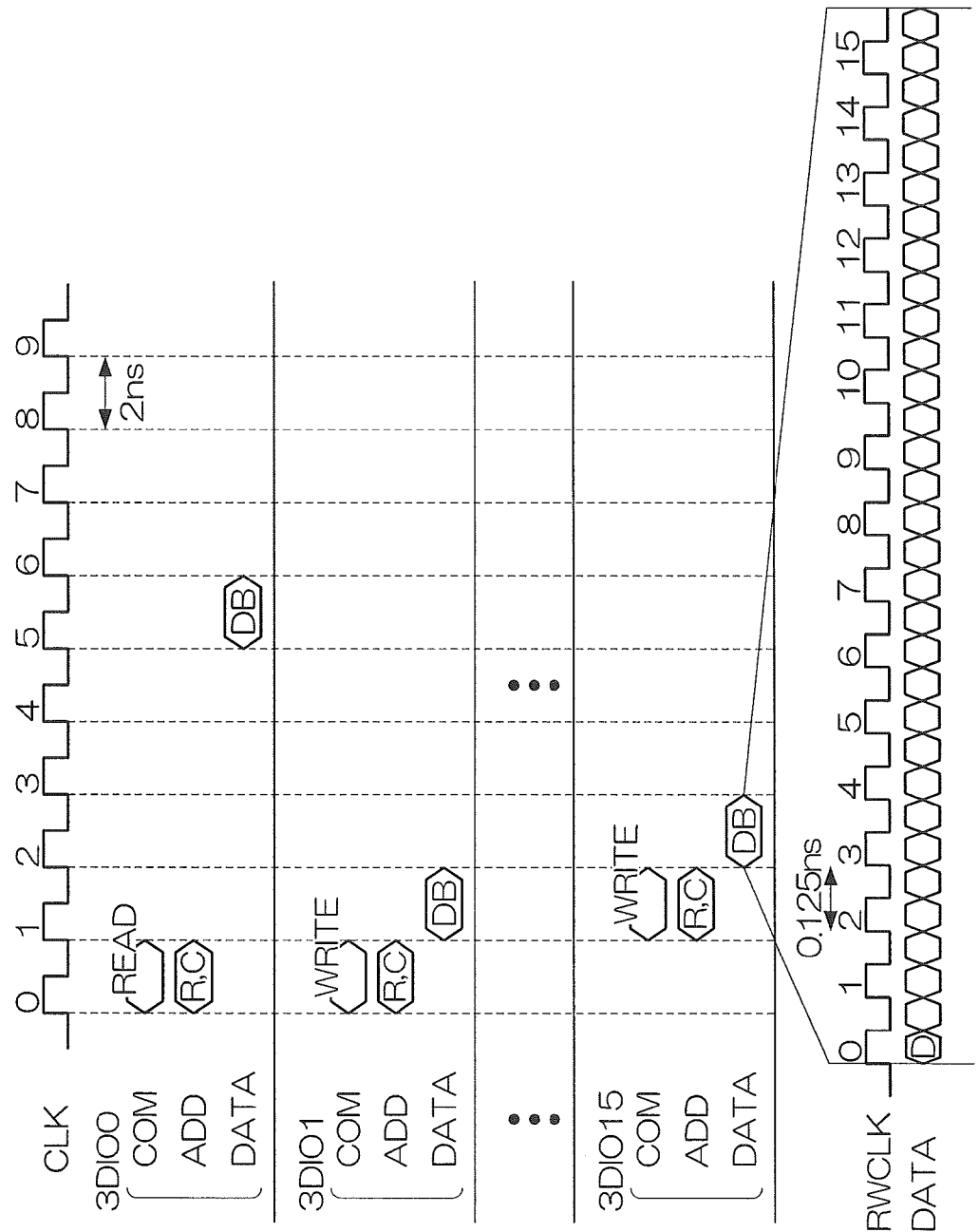
FIG. 2 is a timing chart illustrating operations of data transfer between the SoC chip and the DRAM chip shown in FIGS. 1A and 1B.

FIG. 2 is a timing chart showing data transmission between the DRAM chip 1 and the SoC chip 2 in the semiconductor device 10 of FIGS. 1A and 1B. FIG. 2 shows an example of waveforms of the I/O 3DIO0 to 3DIO15, which operate in synchronization with a clock CLK of a cycle of 2 ns (nanoseconds). In this embodiment, I/Os (that is, a plurality of command terminals, a plurality of address terminals, and a plurality of data terminals) of a command COM, an address ADD, and data DATA are independently allocated to the DRAM cores MEM0 to MEM15 since the number of I/O lines and the number of pins 3DIO can be increased in the DRAM chip 1 of the multi-core configuration.

Accordingly, in the semiconductor device 10 of FIG. 1B, none of the DRAM cores MEM0 to MEM15 is affected by operation states of other cores, and each core can independently execute commands such as a read command READ, a write command WRITE, and the like. Thus, interference from/to other cores does not occur and an effective data transmission rate can be easily increased. Addresses are simultaneously input in a row/column non-multi-type, and precharge is performed after an array operation is terminated. Each core performs a 32-bit prefetch operation, and data is input/output between the DRAM cores MEM0 to MEM15 and the CPU cores CPU0 to CPU15 in synchronization with H and L levels of a clock RWCLK (read/write clock) having a cycle of $\frac{1}{16}$ of the clock CLK.

In an example shown in FIG. 2, in a 0th clock CLK, a read command and a read address are input from the CPU core CPU0 to the DRAM core MEM0 by the I/O 3DIO0 between the DRAM core MEM0 and the CPU core CPU0. A write command and a write address are input from the CPU core CPU1 to the DRAM core MEM1 by the I/O 3DIO1 between the DRAM core MEM1 and the CPU core CPU1.

Next, in a 1st clock CLK, write data DB is input from the CPU core CPU1 to the DRAM core MEM1. A write command and a write address are input from the CPU core CPU15 to the DRAM core MEM15 by the I/O 3DIO15 between the DRAM core MEM15 and the CPU core CPU15. Next, in a 2nd clock CLK, write data DB is input from the CPU core CPU15 to the DRAM core MEM15.

In a 5th clock CLK, read data DB is output from the DRAM core MEM0 to the CPU core CPU0 by the I/O 3DIO0. As described above, the write and read data DATA are input/output in synchronization with the H and L levels of the clock RWCLK of a 0.125 ns cycle, which is $\frac{1}{16}$ of the 2 ns cycle of the clock CLK.

Figure 3:
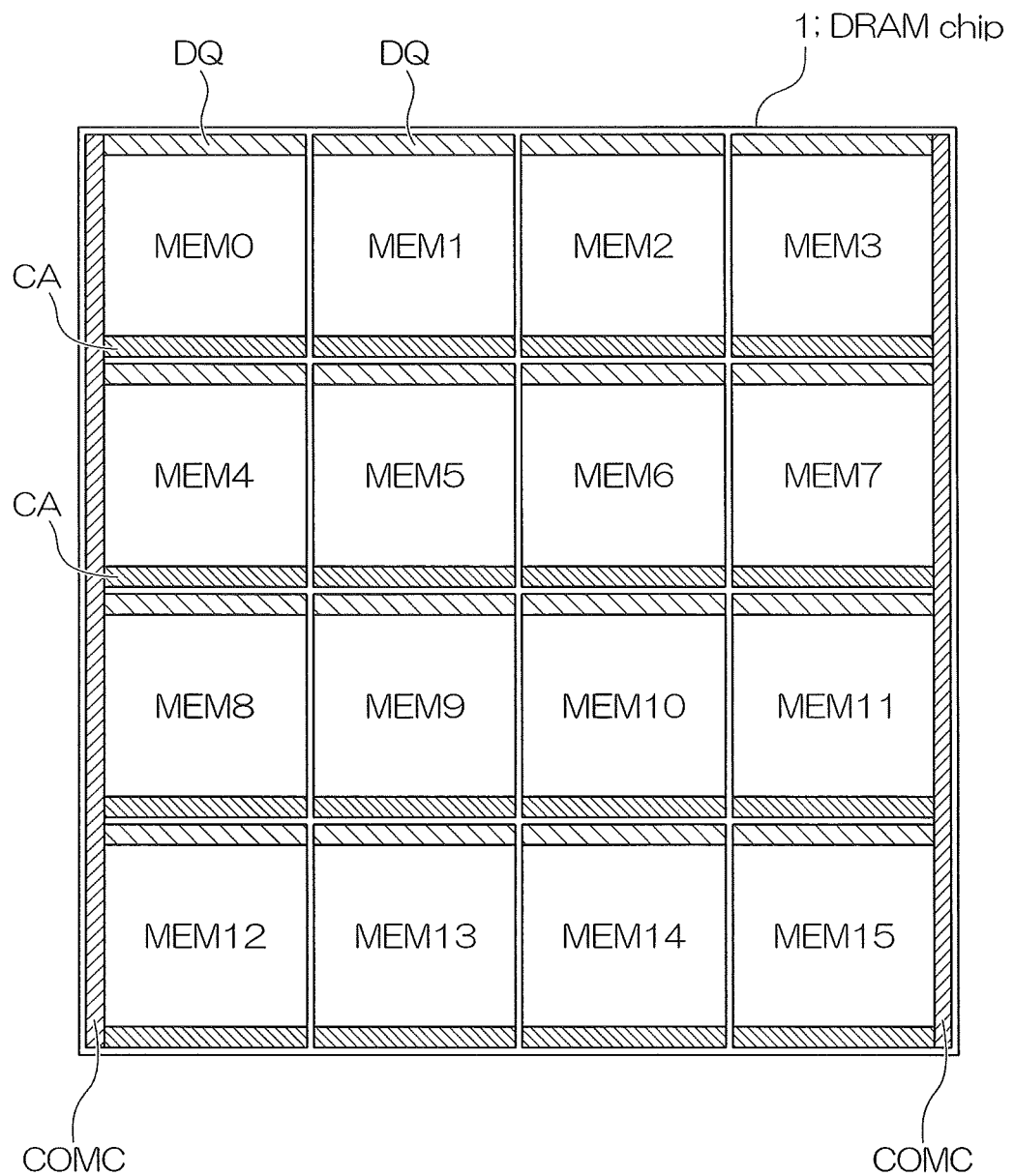
FIG. 3 is a plan view illustrating configurations of the DRAM chip shown in FIGS. 1A, 1B and 2.

FIG. 3 is a plan view schematically showing a configuration example of the DRAM chip 1 of FIG. 1B. In the multi-core configuration of this embodiment, the entirety of the DRAM chip 1 includes the 16 DRAM cores MEM0 to MEM15. A command address input circuit CA and a data I/O circuit DQ are arranged within each core. A common circuit COMC is arranged in a peripheral portion of the DRAM chip 1. A power supply circuit, a clock control circuit, a fuse, and the like are arranged in the common circuit COMC. The data I/O circuit DQ and the common circuit COMC of each core correspond to the I/O circuit 3DIOC of FIG. 1A.

The DRAM cores MEM0 to MEM15 of this embodiment have a size of the core itself, which is significantly smaller than a general-purpose DRAM of the related art, and can operate at high speed. For example, the DRAM chip 1 of this embodiment is configured so that each core inputs/outputs data at 64 GB/s so as to provide 4 Gb and 1 TB/s in the entire chip.

Figure 4:
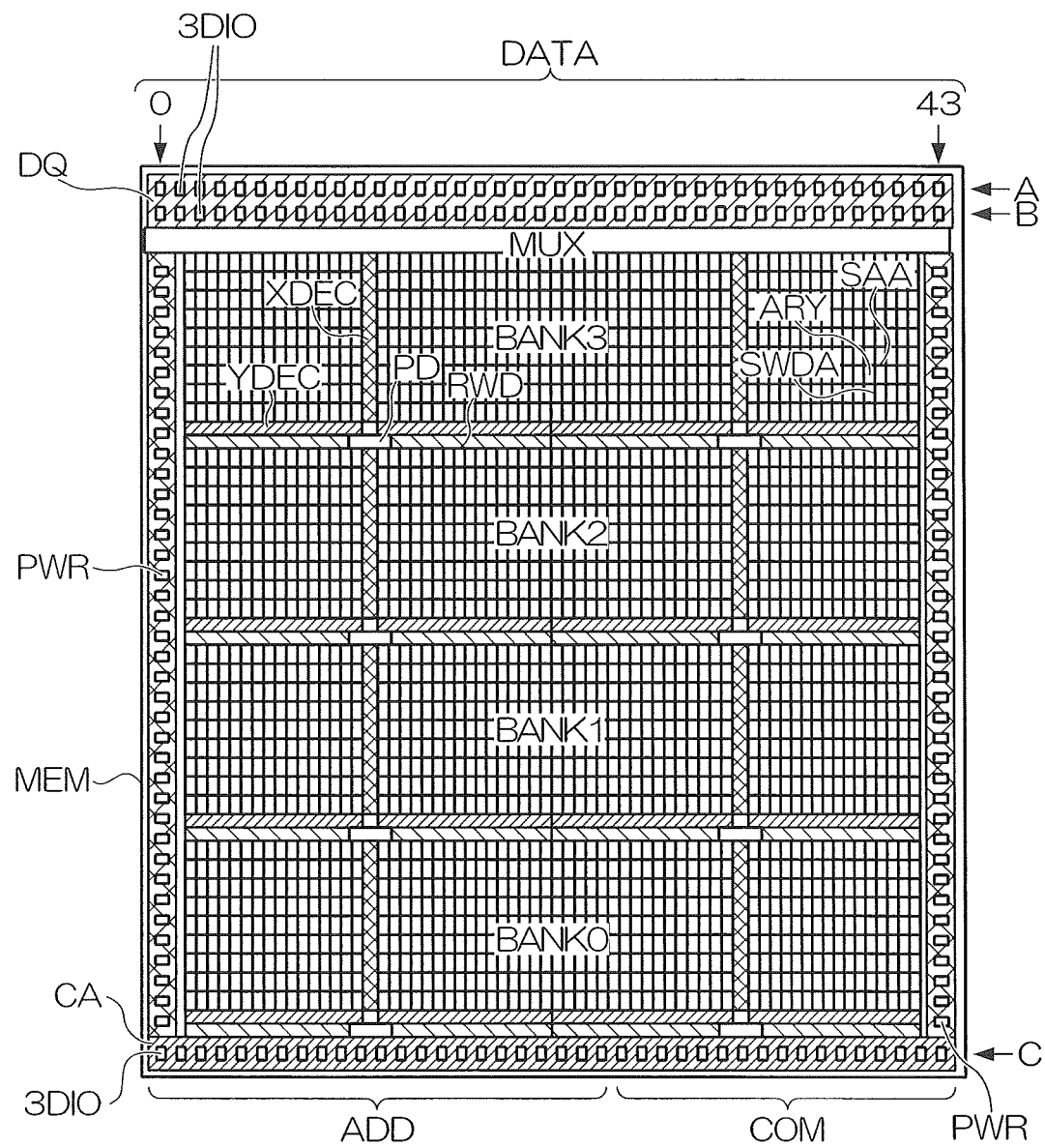
FIG. 4 is a plan view illustrating configurations of DRAM cores in the DRAM chip shown in FIGS. 1A, 1B, 2 and 3.

FIG. 4 is a plan view schematically showing a configuration example of the DRAM cores MEM0 to MEM15 of FIG. 3. In this regard, FIG. 4 shows the DRAM cores MEM0 to MEM15 of FIG. 3 as a DRAM core MEM. FIG. 5 shows an arrangement of I/O pins 3DIO for data DATA, an address ADD, and a command COM of the DRAM core MEM of FIG. 4.

The DRAM core MEM shown in FIG. 4 is divided into 4 banks BANK0 to BANK3. A column decoder XDEC, a row decoder YDEC, a read/write circuit RWC, a pre-decoder PD, and the like are arranged in each bank. A sense amplifier array SAA and a sub-word driver array SWDA are arranged to correspond to each memory array ARY.

In FIG. 4, 44 I/O pins for the data DATA among a plurality of I/O pins 3DIO have Nos. 0 to 43 in a lateral direction toward the figure and are arranged in 2 stages A and B. Also, 44 I/O pins 3DIO for the address ADD and the command COM are arranged in a C stage. An arrangement of I/O pins 3DIO for each of the data DATA, the address ADD, and the command COM is shown in FIG. 5.

In the I/O pins 3DIO for the data DATA, data I/O signals DQ0T/B to DQ31T/B are input/output. Power supplies VDDQ and VSSQ for a plurality of data are distributed and arranged between the plurality of I/O pins 3DIO for the data I/O signals DQ0T/B to DQ31T/B. In the I/O pins 3DIO for the address ADD, bank address signals BA0 and BA1 and address signals A0 to A20 are input. The banks BANK0 to BANK3 of access destinations are selected by the bank address signals BA0 and BA1. In the I/O pins 3DIO for the command COM, command signals such as a negative-logic chip select signal CSB, a row address strobe signal RASB, a column address strobe signal CASB, a write enable signal WEB, a reset signal RESTB, and the like are input. A read or write command is issued by a combination of the command signals.

In the DRAM core MEM as shown in FIG. 4, power supply pins PWR are arranged in a peripheral portion of the core. At a level of the present state, the pitch of the through via VIA is about 50 μm, and about 40 pins can be arranged in line. In the DRAM core MEM constituted as described above, for example, the banks BANK0 to BANK3 operate in a cycle of 8 ns, and the 4 banks perform an interleaving operation every 2 ns.

Figure 6:
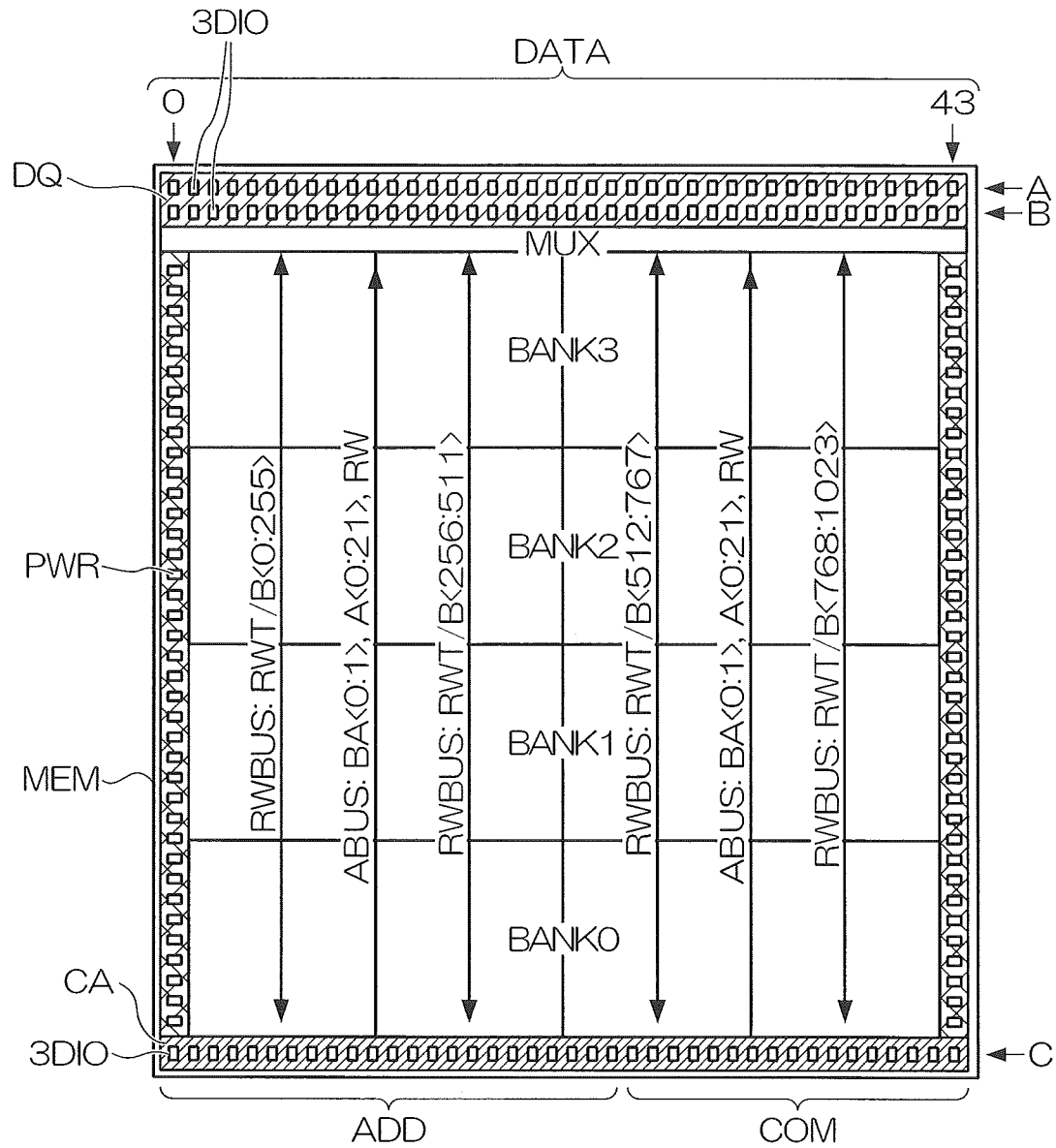
FIG. 6 is a plan view illustrating layout of read/write bus and address bus in the DRAM core shown in FIG. 4.

FIG. 6 is a plan view schematically showing an arrangement of data buses and address buses of the DRAM core MEM of FIG. 4. In the DRAM core MEM, 32 sets of data I/O pins (I/O pins 3DIO for data I/O signals DQ0T/B to DQ31T/B) are connected to 1024 sets of read/write buses RWBUS via a 32:1 multiplexer (MUX). 1024 bits are read from a memory array AR in a 2 ns cycle, and a transmission rate of 16 Gbps is secured. The read/write bus RWBUS is wired on the DRAM core MEM, and is connected to the read/write circuits RWC of the banks BANK0 to BANK3. Signals input from the I/O pins 3DIO for the command COM and the address ADD are input to the command address input circuit CA, and are connected to the pre-decoders PD of the banks BANK0 to BANK3 via an address bus ABUS. According to this configuration, operations within the bank and bus transmission are separated, so that high speed can be accommodated. Row and column addresses are simultaneously supplied to the banks BANK0 to BANK3 via the address bus ABUS.

Figure 7:
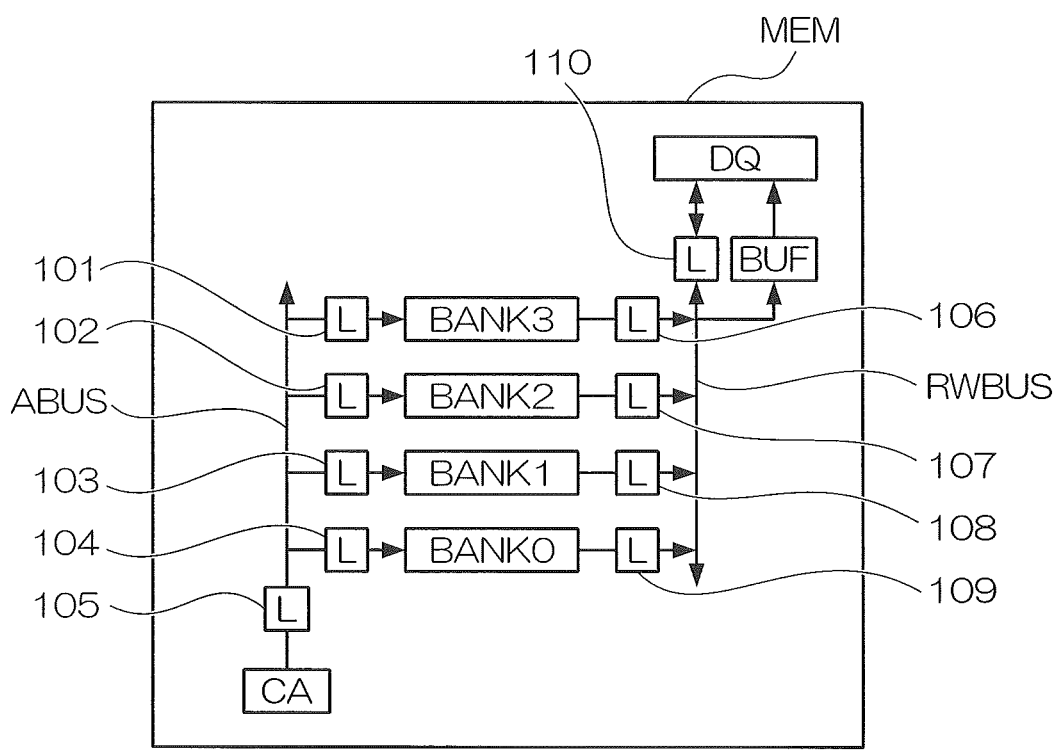
FIG. 7 is a block diagram illustrating circuit configuration of the DRAM core shown in FIG. 4.

FIG. 7 is a block diagram showing a basic circuit configuration of the DRAM core MEM of FIG. 4. Address and data access paths are configured in a 4-stage pipeline including the command address input circuit CA, the address bus ABUS, the banks BANK0 to BANK3, the read/write bus RWBUS, and the data I/O circuit DQ, the stages are separated by latch circuits (L) 101 to 104 and 106 to 109 to be controlled by a clock signal, and an operation frequency is improved by a pipeline operation. An output of the command address input circuit CA is connected to the address bus ABUS via the latch circuit (L) 105, and the address bus ABUS is connected to each of the banks BANK0 to BANK3 via any one of 4 sets of the latch circuits (L) 101 to 104 provided for each bank. Each of the banks BANK0 to BANK3 is connected to the read/write bus RWBUS in each fixed cycle of a clock signal by time division via any one of the 4 sets of the latch circuits (L) 106 to 109 provided for each bank in the pipeline operation. The read/write bus RWBUS is connected to the latch circuit (L) 110 or the data I/O circuit DQ via a delay buffer BUF. In the case of the write operation, the delay buffer BUF is used to retain read data read according to a previous read command.

Figure 8:
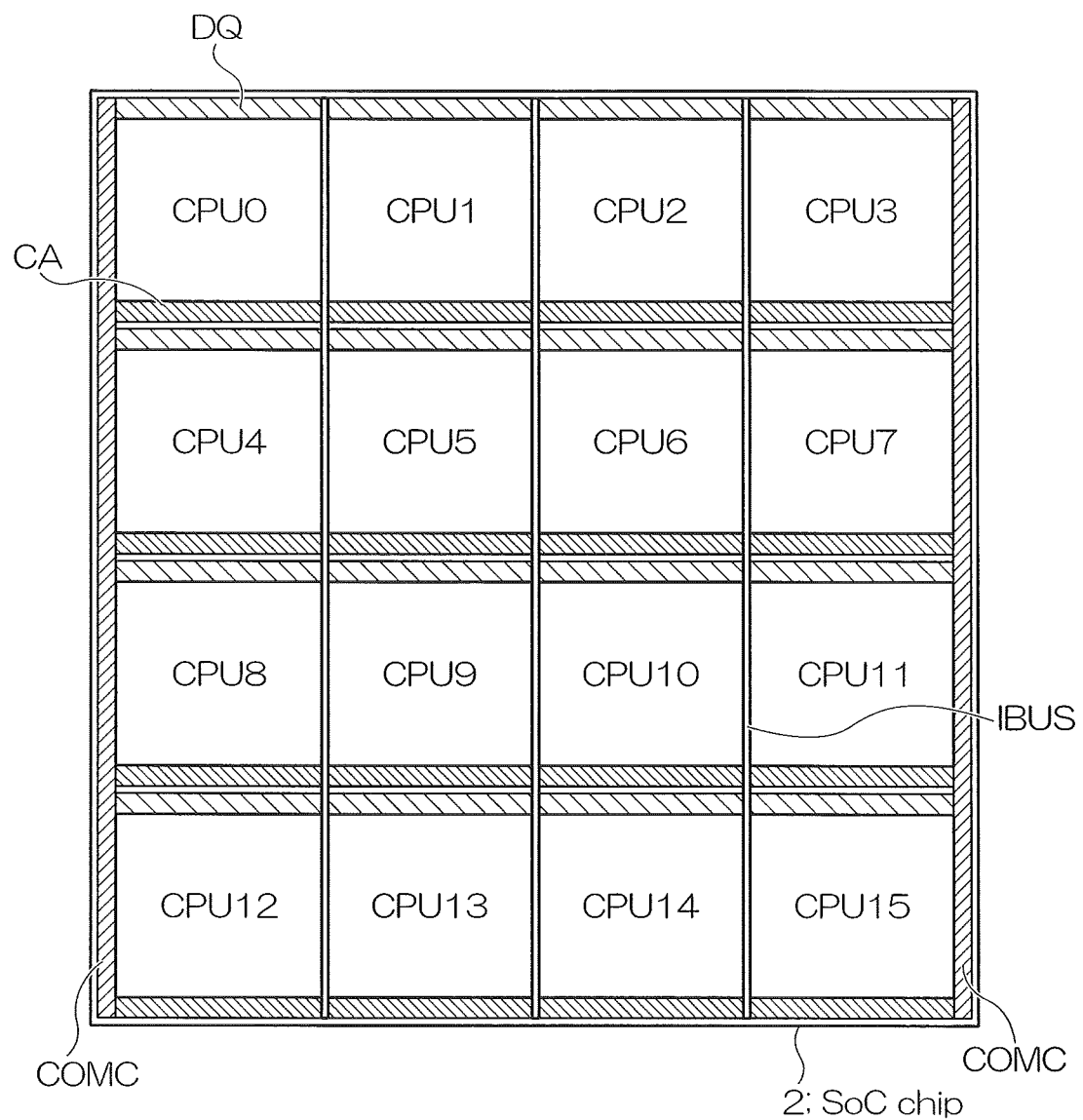
FIG. 8 is a plan view illustrating configurations of the SoC chip shown in FIG. 1.

FIG. 8 is a plan view schematically showing a configuration example of the SoC chip 2 of FIG. 1. Like the DRAM chip 1, the SoC chip 2 also includes the 16 CPU cores CPU0 to CPU15. In the CPU cores CPU0 to CPU15, a plurality of internal buses IBUS are arranged. In the periphery of the CPU cores CPU0 to CPU15, common circuits COMC such as a power supply circuit, and a clock control circuit are arranged. Arrangement positions of the command address input circuits CA and the data I/O circuits DQ arranged within the CPU cores CPU0 to CPU15 are consistent with those of the DRAM cores MEM0 to MEM15 corresponding thereto, so that I/O pin positions of the DRAM cores MEM0 to MEM15 are consistent with those of the CPU cores CPU0 to CPU15. Thereby, a distance of the through via VIA is shortened and a high-speed operation is possible. However, when a size of the DRAM cores MEM0 to MEM15 is different from that of the CPU cores CPU0 to CPU15, a connection is established by shifting the position of the through via VIA by the interposer. In this case, an operation rate is degraded, but it is unnecessary to cause chip layouts to be consistent with each other, so that cost reduction is possible since a chip size can be reduced.

Figure 9:
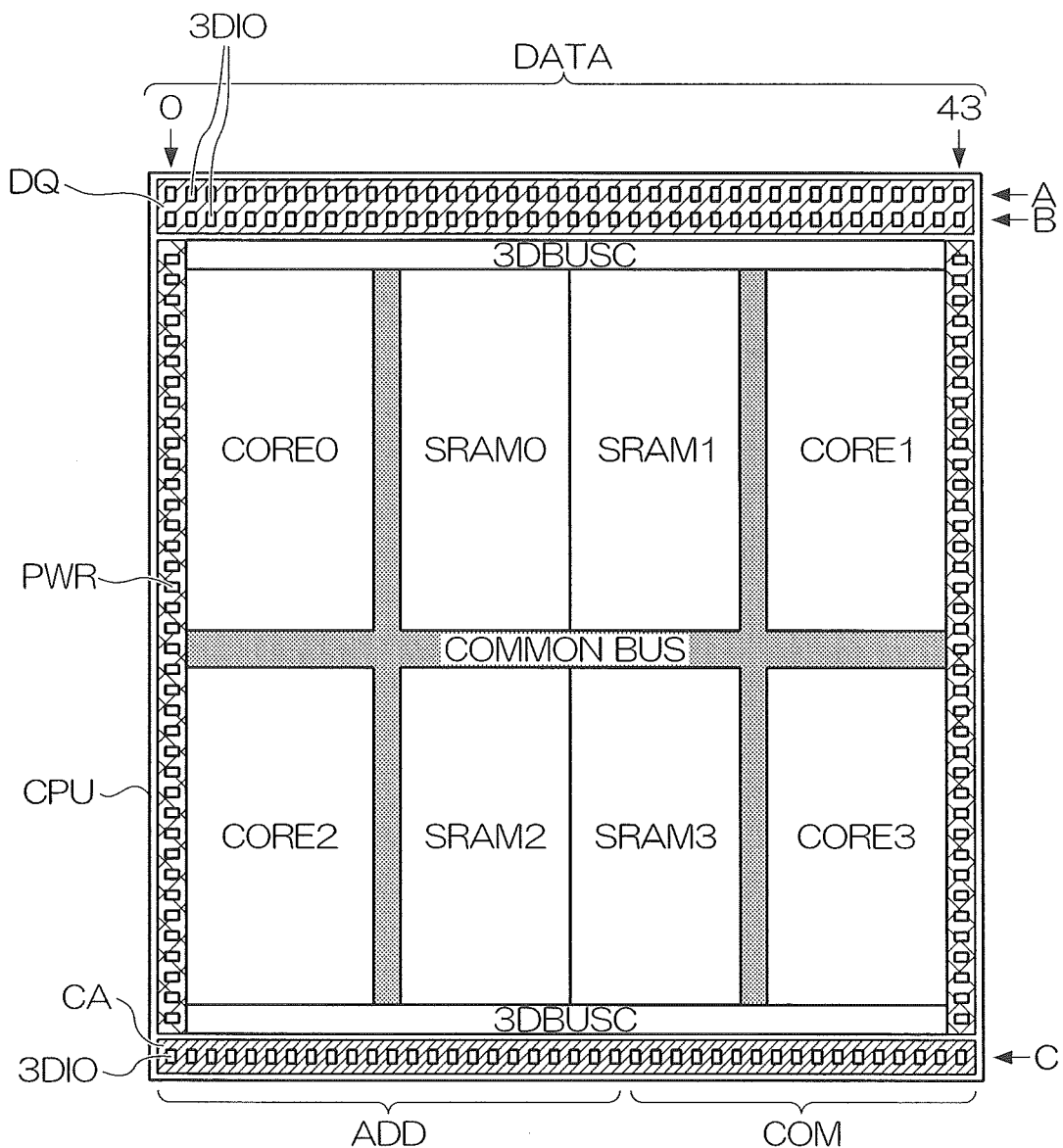
FIG. 9 is a plan view illustrating configurations of CPU cores shown in FIG. 8.

FIG. 9 is a plan view schematically showing a configuration example of the CPU cores CPU0 to CPU15. In FIG. 9, the CPU cores CPU0 to CPU15 of FIG. 8 are shown as a CPU core CPU. The CPU core CPU is further divided into internal cores CORE0 to CORE3, and static random access memories (SRAMs) 0 to 3 are arranged. In the CPU core CPU, I/O pins 3DIO for DQ, the address ADD, and the command COM connected to the DRAM core MEM are arranged as shown in FIG. 5. The power supply pins PWR for supplying power from the CPU core CPU to the DRAM core MEM are arranged in a peripheral portion of the core. For example, the pitch of the through via VIA is about 50 μm, and about 40 pins can be arranged in line. Pin positions of the DRAM core MEM are consistent with those of the CPU cores CPU, so that a distance of the through via VIA is shortened and a high-speed operation is possible.

Figure 10:
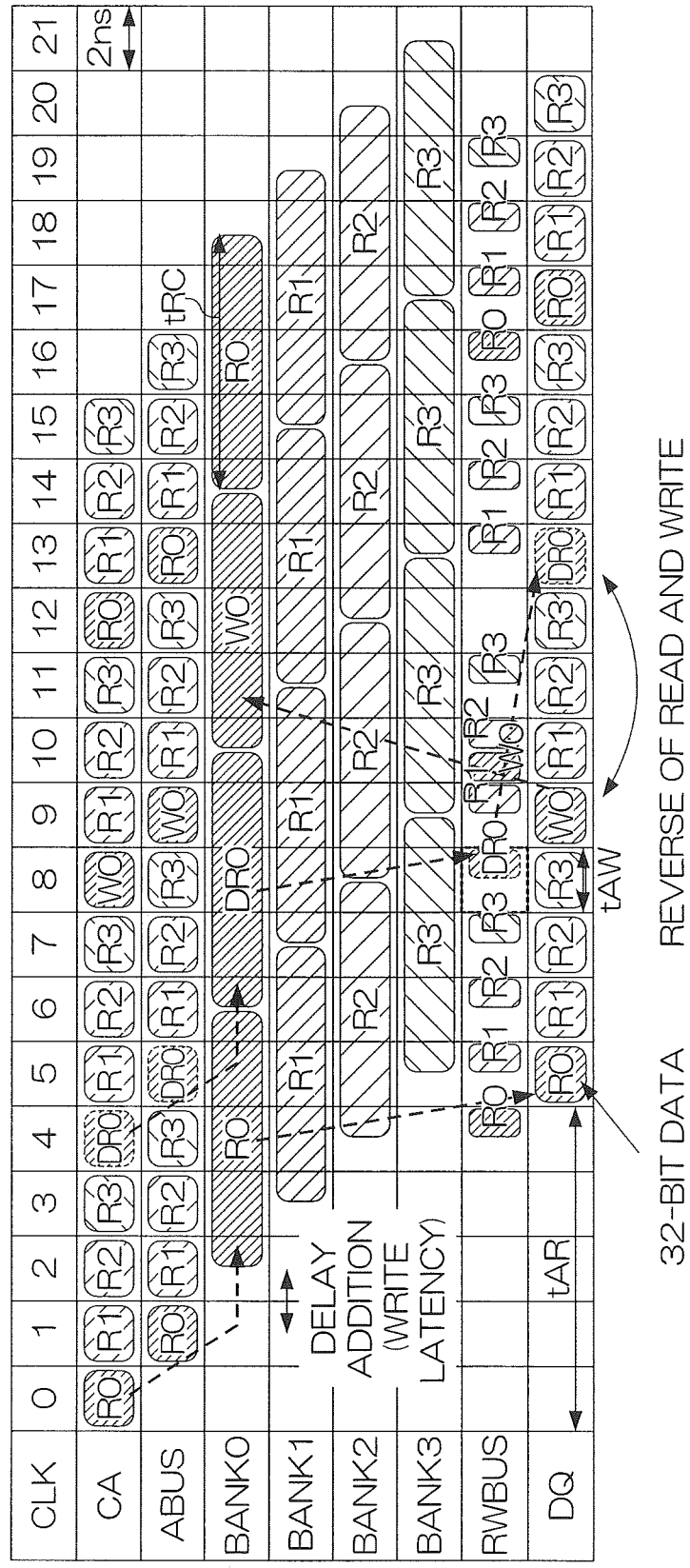
FIG. 10 is a timing chart illustrating timings of operations of the DRAM core shown in FIG. 7.

FIG. 10 is a timing chart showing an example of operation timings of the circuit of FIG. 7. In cycles 0 to 21 of a clock CLK of a cycle of 2 ns, an input signal (CA) directed to the command address input circuit CA, a signal (ABUS) on the address bus ABUS, signals (BANK0 to BANK3) within the banks BANK0 to BANK3, a signal (RWBUS) on the read/write bus RWBUS, and an I/O signal (DQ) of the data I/O circuit DQ are shown. R0 to R3 correspond to signals of a read command, a read address, read data, and the like for the banks BANK0 to BANK3. W0 corresponds to a signal such as a write command, a write address, write data, or the like for the bank BANK0. DR0 denotes a read command, a read address, read data, or the like when output data (read data) from the I/O circuit DQ is delayed and output as delay read (DR) directed to the bank BANK0 as compared with the normal case.

The DRAM core MEM of this embodiment causes the 4 banks BANK0 to BANK3 to sequentially perform the pipeline operation (that is, the bank interleaving operation) every 2 ns (=1 cycle of CLK). In this embodiment, the read or write operation is performed in order of banks 0 to 3, that is, in order of banks 0→1→2→3→0→1→2→3→0→. . . . In this case, each bank performs the read or write operation at a maximum rate at every 4×2 ns (every 4 CLK cycles). That is, each bank performs one read or write operation at a maximum rate of an 8 ns cycle (=4 cycles of the clock signal CLK). In this embodiment, 8 ns is divided into 4 slots every 2 ns. A first slot is allocated to the bank 0, a second slot is allocated to the bank 1, a third slot is allocated to the bank 2, and the last slot is allocated to the bank 3.

The read/write bus RWBUS can operate in a 1 ns cycle (a half-cycle of CLK). The first half can allocated to the write operation and the second half can be allocated to the read operation. Write latency (a time until write data is input after the write command is input) is 1 cycle (=1 cycle of CLK=2 ns). Read latency of the normal case (that is, the case where no delay read operation is performed) (a time until read data is output after the read command is input) is 5 cycles (=5 cycles of CLK=10 ns). The delay of 1 cycle (=1 cycle of CLK=2 ns) of the write latency is added to the array activation of a read time (that is, until access to a memory array of an address is started after the address is input to the address bus ABUS).

If the write operation next to the read operation is input in the same bank, a previous read operation is handled as the delay read (DR) operation, the read data (DR) of the delay read operation is output after the write operation. Thus, if a delay buffer BUF is provided in an input of the I/O circuit DQ and write data is input to the data I/O circuit DQ, data previously read from the same bank is retained in the buffer. Since the write latency is 1 CLK cycle, the normal read latency is 5 CLK cycles, and 1 cycle of the pipeline operation is 4 CLK cycles as described above, a slot in which read data is output is consistent with a slot in which write data is input when the write operation is input in a slot next to a read slot for the same bank if the normal read latency is used, and a data collision occurs in the I/O (DQ) of the I/O circuit DQ. In this embodiment, if the write operation is input in a slot after the read operation, the read data is retained in the delay buffer BUF, an output of the read data is delayed, and the I/O circuit DQ can be used for the write operation. Next, previous read data retained in the delay buffer BUF in a slot in which the read operation is input, is output. Thereby, a position of an allocation slot to each bank is not changed, and the banks can be accessed in a fixed order of banks 0→1→2→3→0→ . . . without a collision of data between the banks. According to this embodiment, an effective data rate can be improved without causing a bubble to occur upon read/write switching.

Hereinafter, an operation example shown in FIG. 10 will be described in detail. In the example of FIG. 10, a read command and a read address (R0) for the bank 0 are input to the command address input circuit CA in the clock CLK=0. A read command and a read address (R1) for the bank 1 are input to the command address input circuit CA in the next clock CLK=1. Thereafter, a read command and a read address (R2) for the bank 2 are input to the command address input circuit CA in the clock CLK=2, a read command and a read address (R3) for the bank 3 are input to the command address input circuit CA in the clock CLK=3, and a read command and a read address (DR0) for the bank 0 are input to the command address input circuit CA in the clock CLK=4. Here, R0 and DR0 have the same specification in terms of the input read command and the input read address, but are differently marked since the read latency is different.

In the operation example of FIG. 10, R0 is input to the command address input circuit CA in the clock CLK=0, the read command and the read address (DR0) for the bank 0 are input in the next slot (the clock CLK=4), and a write command and a write address (W0) for the bank 0 are input in the next slot (the clock CLK=8). Thus, in regard to the read command R0 of the clock CLK=0, it is possible to output the read data R0 from the I/O DQ in the clock CLK=5 by using the 5 CLK cycles of the normal read latency. On the other hand, in regard to the read command DR0 of the clock CLK=4, the read command DR0 of the clock CLK=4 is initially received from the CPU as the normal read command, but it is processed within the DRAM as the delay read DR0 since a command to the bank 0 is the write command W0 in the next CLK=8. If the read data DR0 based on the read command of CLK=4 is output using the 5 CLK cycles of the normal read latency, the read data DR0 is output from the I/O DQ in the clock CLK=9, but a data collision occurs since the write data W0 of the write command W0 of the clock CLK=8 is also input from the I/O DQ in the clock CLK=9 of 1 CLK cycle of the write latency. In this example, the read data DR0 is output from the I/O DQ in the clock CLK=13 by using the read latency as 9 CLK cycles in the read command of the clock CLK=4 (since the read command R0 is input in CLK=12). That is, the read operation of the clock CLK=4 is processed as the delay read (DR0) operation having latency, which is greater than the normal read latency.

The read command and the read address (R1) for the bank 1 are input to the command address input circuit CA in the clock CLK=5, the read command and the read address (R2) for the bank 2 are input to the command address input circuit CA in the clock CLK=6, the read command and the read address (R3) for the bank 3 are input to the command address input circuit CA in the clock CLK=7, and the write command and the write address (W0) for the bank 0 are input to the command address input circuit CA in the clock CLK=8 as described above. Thereafter, likewise, R1, R2, R3, R0, R1, R2, and R3 are sequentially input in the clock CLK=9 to 15.

On the address bus ABUS, an input address directed to the command address input circuit CA is shifted by 1 CLK cycle, and R0 (CLK=1), R1, R2, R3, DR0, R1, R2, R3, W0, R1, R2, R3, R0, R1, R2, and R3 (CLK=16) are output.

In the bank BANK0, a read operation based on R0 input to the command address input circuit CA in the clock CLK=0 is performed in the second half of the clock CLK=2 to the first half of the clock CLK=6. Also, a read operation based on DR0 input to the command address input circuit CA in the clock CLK=4 is performed in the second half of the clock CLK=6 to the first half of the clock CLK=10. A write operation based on W0 input to the command address input circuit CA in the clock CLK=8 and W0 input to the data I/O circuit DQ in the clock CLK=9 are performed in the second half of the clock CLK=10 to the first half of the clock CLK=14. A read operation based on R0 input to the command address input circuit CA in the clock CLK=12 is performed in the second half of the clock CLK=14 to the first half of the clock CLK=18.

In the bank BANK1, a read operation based on R1 input to the command address input circuit CA in the clock CLK=1 is performed in the second half of the clock CLK=3 to the first half of the clock CLK=7. A read operation based on R1 input to the command address input circuit CA in the clock CLK=5 is performed in the second half of the clock CLK=7 to the first half of the clock CLK=11. A read operation based on R1 input to the command address input circuit CA in the clock CLK=9 is performed in the second half of the clock CLK=11 to the first half of the clock CLK=15. A read operation based on R1 input to the command address input circuit CA in the clock CLK=13 is performed in the second half of the clock CLK=15 to the first half of the clock CLK=19.

In the bank BANK2, a read operation based on R2 input to the command address input circuit CA in the clock CLK=2 is performed in the second half of the clock CLK=4 to the first half of the clock CLK=8. A read operation based on R2 input to the command address input circuit CA in the clock CLK=6 is performed in the second half of the clock CLK=8 to the first half of the clock CLK=12. A read operation based on R2 input to the command address input circuit CA in the clock CLK=10 is performed in the second half of the clock CLK=12 to the first half of the clock CLK=16. A read operation based on R2 input to the command address input circuit CA in the clock CLK=14 is performed in the second half of the clock CLK=16 to the first half of the clock CLK=20.

In the bank BANK3, a read operation based on R3 input to the command address input circuit CA in the clock CLK=3 is performed in the second half of the clock CLK=5 to the first half of the clock CLK=9. A read operation based on R3 input to the command address input circuit CA in the clock CLK=7 is performed in the second half of the clock CLK=9 to the first half of the clock CLK=13. A read operation based on R3 input to the command address input circuit CA in the clock CLK=11 is performed in the second half of the clock CLK=13 to the first half of the clock CLK=17. A read operation based on R3 input to the command address input circuit CA in the clock CLK=15 is performed in the second half of the clock CLK=17 to the first half of the clock CLK=21.

In the read/write bus RWBUS, data R0 read from the bank BANK0 is transmitted in the second half of the clock CLK=4. Data R1 read from the bank BANK1 is transmitted in the second half of the clock CLK=5. Data R2 read from the bank BANK2 is transmitted in the second half of the clock CLK=6. Data R3 read from the bank BANK3 is transmitted in the second half of the clock CLK=7. Data DR0 read from the bank BANK0 is transmitted in the second half of the clock CLK=8. Data R1 read from the bank BANK1 is transmitted in the second half of the clock CLK=9. Data W0 input to the data I/O circuit DQ in the clock CLK=9 is transmitted in the first half of the clock CLK=10. Data R2 read from the bank BANK2 is transmitted in the second half of the clock CLK=10. Data R3 read from the bank BANK3 is transmitted in the second half of the clock CLK=11. Data R1 to R3 and R0 to R3 read from the banks BANK1 to BANK3 and BANK0 to BANK3 are transmitted in the second halves of the clock CLK=13 to 19.

Data R0 output onto the read/write bus RWBUS in the second half of CLK4 is output from the I/O of the data I/O circuit DQ in the clock CLK5 (and output to the side of the CPU core CPU; hereinafter the same is true). Data R1 output onto the read/write bus RWBUS in the second half of CLK5 is output in the clock CLK6. Data R2 output onto the read/write bus RWBUS in the second half of CLK6 is output in the clock CLK7. Data R3 output onto the read/write bus RWBUS in the second half of CLK7 is output in the clock CLK8. In the clock CLK9, write data W0 serving as a write target of a write command W0 input from the CPU core CPU to the command address input circuit CA in CLK=8 is input. Data R1 output onto the read/write bus RWBUS in the second half of CLK9 is output in the clock CLK10. Data R2 output onto the read/write bus RWBUS in the second half of CLK10 is output in the clock CLK11. Data R3 output onto the read/write bus RWBUS in the second half of CLK11 is output in the clock CLK12. Data DR0, which is output onto the read/write bus RWBUS in the second half of clock CLK8 and is retained in the delay buffer BUF, is output in the clock CLK13. Subsequently, data R1 to R3 and R0 to R3 output onto the read/write bus RWBUS in the second halves of the clocks CLK=13 to 19 are output in the clocks CLK=14 to 20.

In the example shown in FIG. 10, the read command DR0 for the bank 0 is input to the command address input circuit CA in the clock CLK=4, and thereafter the write command W0 for the bank 0 is input in the clock CLK=8. The write data W0 for the bank 0 is input from the I/O of the data I/O circuit DQ in the clock CLK=9, and thereafter the read data DR0 from the bank 0 is output in the clock CLK=13. In this embodiment as described above, if a write instruction for the same bank is received in a slot after the read operation, a data I/O on the I/O DQ is reversed in order of read data after write data.

In the example shown in FIG. 10, tAR (an address setup time before the read operation) is 10 ns (5 CLK cycles), tAW (an address setup time before the write operation) is 2 ns (1 CLK cycle), and tRC (row cycle latency: waiting time in the case of access to the same bank) is 8 ns (4 CLK cycles). Also, tAR is set to a sum of tAW and tRC. The data R0 to R3, DR0, and W0 input/output by the data I/O circuit DQ in clocks CLK are 32-bit data described with reference to FIG. 2.

Figure 11:
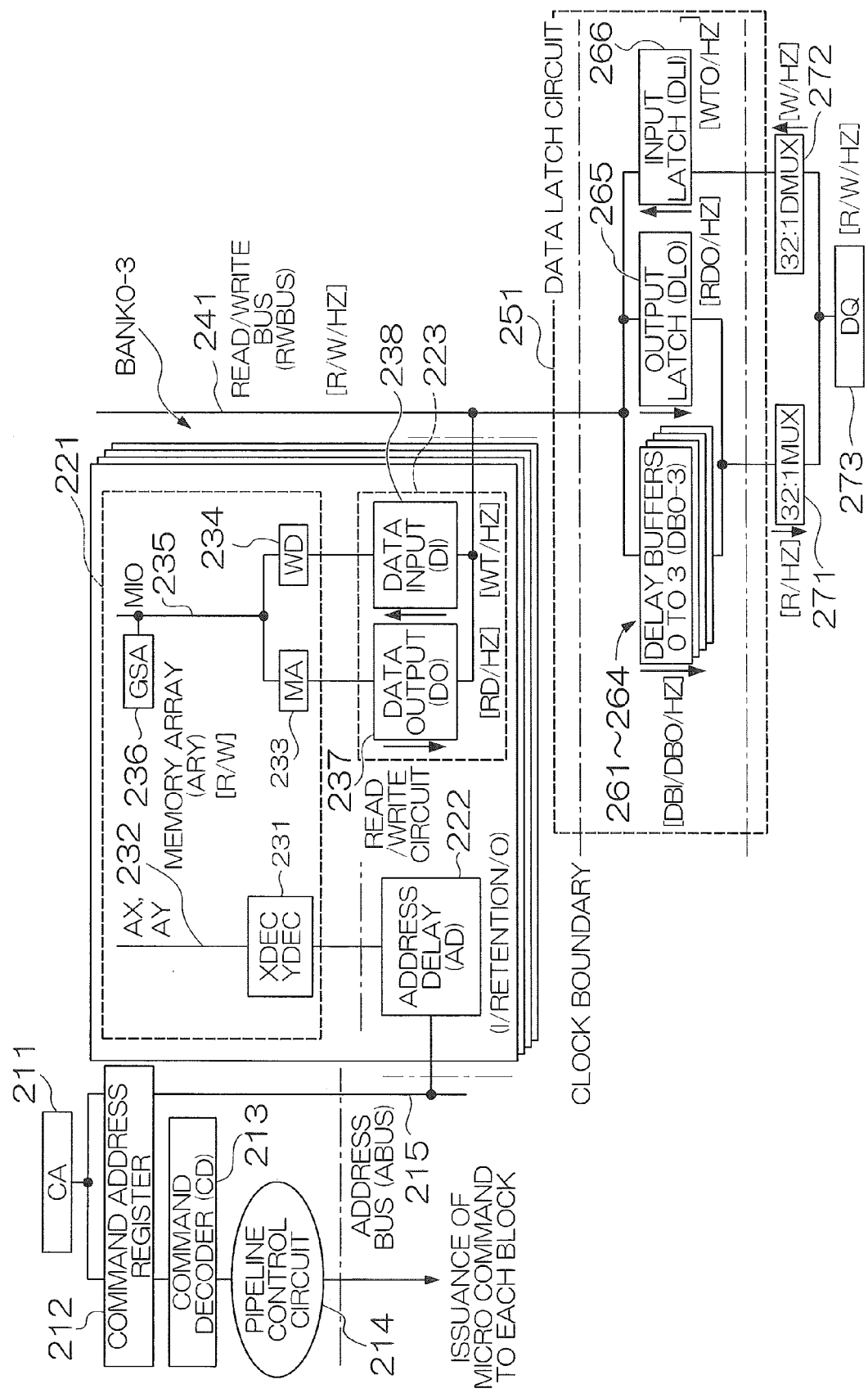
FIG. 11 is a block diagram illustrating configurations, including address data bus, of the DRAM core shown in FIG. 4.

FIG. 11 is a block diagram showing an example of a basic configuration of an address/data path part in the DRAM core MEM of FIG. 4. In the configuration shown in FIG. 11, a command address input circuit 211 corresponds to the command address input circuit CA of FIG. 7, a data I/O circuit 273 corresponds to the data I/O circuit DQ of FIG. 7, and delay buffers 0 to 3 (DB0 to DB3) 261 to 264 correspond to the delay buffer BUF of FIG. 7. A clock boundary is indicated by a dashed dotted line.

The command address input circuit 211 of FIG. 11 is connected to a command decoder 213 via a command address register 212, and is connected to an address delay circuit 222 within the banks 0 to 3 (BANK0 to BANK3) via an address bus (ABUS) 215. An output of the command decoder 213 is input to a pipeline control circuit 214. The pipeline control circuit 214 issues a micro command to each block on the basis of the output of the command decoder 213. In this embodiment, the micro command is transmitted before a half clock of each operation.

A memory array 221, the address delay circuit 222, and a read/write circuit 223 are respectively provided in the banks 0 to 3 (BANK0 to BANK3). In this case, a row decoder/column decoder (XDEC/YDEC) 231 connected to the address delay circuit 222, a row address line AX and a column address line AY (collectively referred to as an AX/AY 232) connected to the row decoder/column decoder 231, a main amplifier (MA) 233, a write driver (WD) 234, a main IO line (MIO) 235 connected thereto, a global sense amplifier (GSA) 236 connected to the main IO line 235, and the like are provided in the memory array 221. The read/write circuit 223 has a data output latch 237 and a data input latch 238. The data output latch 237 latches an output of the main amplifier 233 within the memory array 221, and sends the output onto a read/write bus 241 commonly provided in the banks 0 to 3. The data input latch 238 latches data input via the read/write bus 241, and outputs the data to the word line driver 234 within the memory array 221. The address delay circuit 222 is a circuit that delays read address transmission on the address bus (ABUS) 215 connected to the banks 0 to 3 (BANK0 to BANK3) by the write latency.

A data latch circuit 251 includes delay buffers 0 to 3 (261 to 264), an output latch 265, and an input latch 266. A plurality of delay buffers 0 to 3 (261 to 264) are provided in correspondence with the banks 0 to 3, retain delay read data (for example, the delay read data DR0 of FIG. 10) input via the read/write bus 241, and output the data by delaying the output timing. The output latch 265 retains and outputs normal read data (for example, the read data R0 of FIG. 10) input via the read/write bus 241. The input latch 266 retains write data (for example, the write data W0 of FIG. 10) input from a 1:32 demultiplexer (DMUX) 272, and outputs the data to the read/write bus 241.

Data output from the delay buffers 0 to 3 (261 to 264) or the output latch 265 is input to a 32:1 MUX 271. Signals on 32 signal lines are converted into a signal on 1 signal line by the 32:1 MUX 271, and the 1 signal is input to the data I/O circuit (DQ) 273. The 1:32 DMUX 272 converts data output from the data I/O circuit 273 from one signal into 32 signals, and outputs the 32 signals to the input latch 266.

Each circuit block shown in FIG. 11 is operated by receiving a micro command at every half clock of the clock CLK from the pipeline control circuit 214. In FIG. 11, an operation state by a micro command (operation command) for each circuit block is denoted by brackets "[ ]." A read (R) or write (W) operation is set to the memory array 221. An operation of an input (I), retention, or output (O) of an address signal is set to the address delay circuit 222. A read (RD) or high-impedance (HZ) state output operation is set to the data output latch 237. A write (WT) or high-impedance (HZ) operation is set to the data input latch 238. A data read (RD) (=read data transmission), data write (W) (=write data transmission), or high-impedance (HZ) operation is set to the read/write bus 241.

An input (DBI), output (DBO), or high-impedance (HZ) operation is set to the delay buffers 0 to 3 (261 to 264). A read data output (RDO) or high-impedance (HZ) operation is set to the output latch 265. A write data output (WTO) or high-impedance (HZ) operation is set to the input latch 266. A read data output (R) or high-impedance (HZ) operation is set to the 32:1 MUX 271. A write data output (W) or high-impedance (HZ) operation is set to the 1:32 DMUX 272. A read data output (R), write data input (W), or high-impedance (HZ) operation is set to the data I/O circuit 273.

Figure 12:
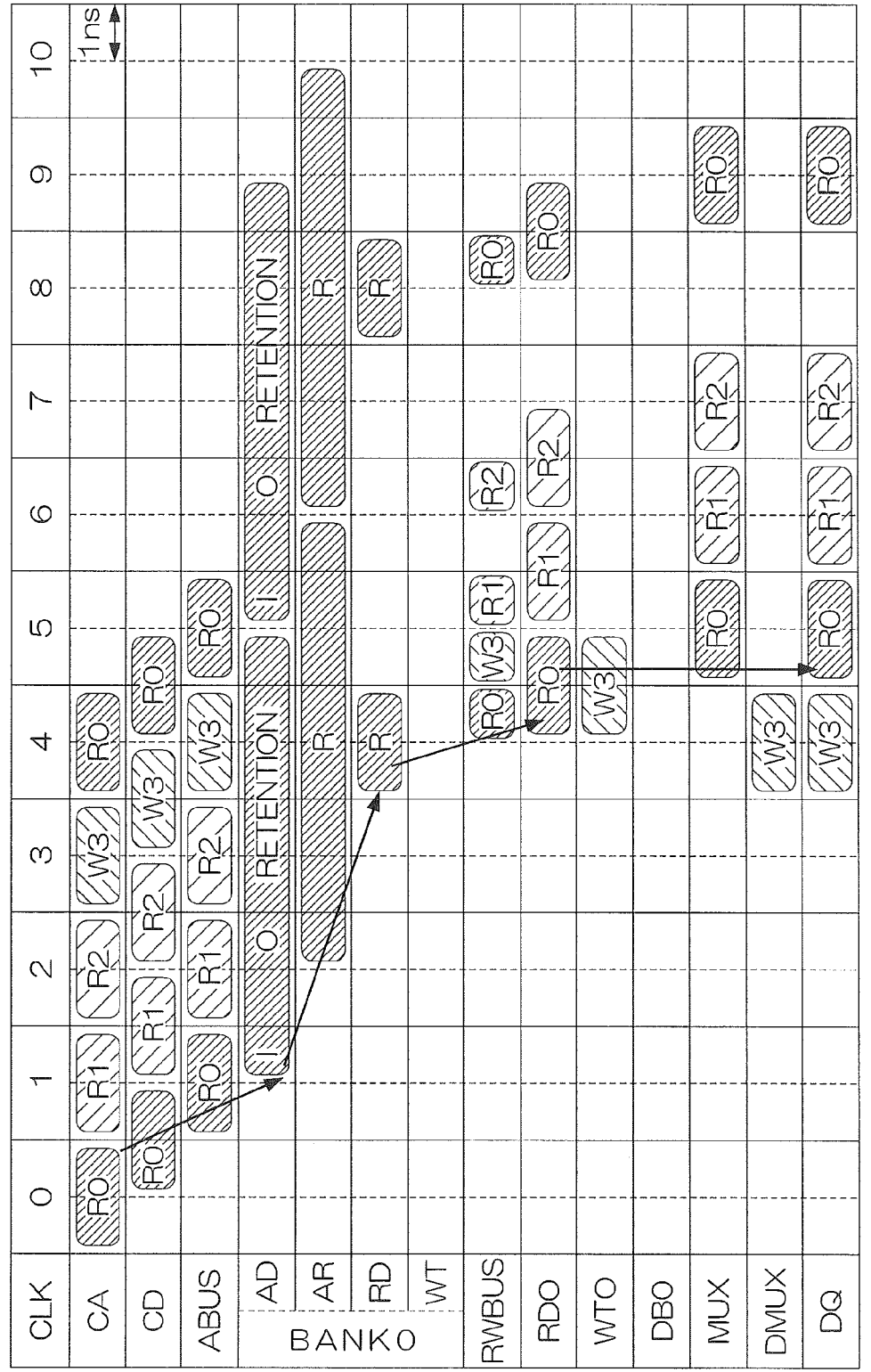
FIG. 12 is a timing chart illustrating timings of operations of the DRAM core shown in FIG. 11.

FIG. 12 is a timing chart showing an example (a micro command (1) and the absence of a data collision at the write time) of operation timings of the configuration of FIG. 11. In cycles 0 to 10 of the clock CLK having a half cycle of 1 ns (a cycle of 2 ns) in FIG. 12, there are shown an input signal (CA) directed to the command address input circuit 211, an input signal (CD) directed to the command decoder 213, a signal (ABUS) on the address bus 215, an operation state (AD) of the address delay circuit 222 of the bank 0 (BANK0), an operation state (AR) of the memory array 221 of the bank 0, an operation state (RD) of the data output latch 237 of the bank 0, an operation state (WT) of the data input latch 238 of the bank 0, a signal (RWBUS) on the read/write bus 241, an output signal (RDO) of the output latch 265, an output signal (WTO) of the input latch 266, an operation state (DB0) of the delay buffer 0 (261), an output signal (MUX) of the 32:1 MUX 271, an output signal (DMUX) of the 1:32 DMUX 272, and an I/O signal (DQ) of the data I/O circuit 273. R0 to R2 denote signals of a read command, a read address, read data, and the like for the banks 0 to 2, or circuit operations by the signals. W3 denotes signals of a write command, a write address, write data, and the like directed to the bank 3 or circuit operations by the signals. Marks R, W, I, and O and Retention respectively represent operation states of a read operation, a write operation, an input operation, an output operation, and a retention operation. In a time when the marks R0 to R2, W3, and the like are not shown, the operation state is in high impedance in a circuit to which a high-impedance operation state is set.

In the example shown in FIG. 12, an input signal (CA) of the command address input circuit 211 is R0 in the clock CLK=0, R1 in CLK=1, R2 in CLK=2, W3 in CLK=3, and R0 in CLK=4. An I/O signal (DQ) of the data I/O circuit 273 is W3 in the clock CLK=4. As indicated by the arrow, in terms of R0 input to the command address input circuit (CA) 211 in the first half of the clock CLK=0, its command is input to the command decoder (CD) 213 in the second half of the clock CLK=0, and its address is output to the address bus (ABUS) 215 in the first half of the clock CLK=1. The address of R0 is input to the address delay circuit (AD) 222 of the bank 0 in the second half of the clock CLK=1, is delayed by 1 CLK cycle, and is output from the address delay circuit (AD) 222 to the row decoder/column decoder 231 in the second half of the clock CLK=2. The output of the address delay circuit (AD) 222 is retained from the second half of the clock CLK=2 to the first half of the clock CLK=5.

The memory array (AR) 221 of the bank 0 performs a series of operations such as a sense operation, a refresh operation, and the like associated with the read operation from the second half of the clock CLK=2 to the first half of the clock CLK=6, and the data output latch 237 (RD) receives read data output from the main amplifier 233 in the first half of the clock CLK=4 and outputs the read data to the read/write bus (RWBUS) 241 in the second half of the clock CLK=4. Read data of R0 transmitted to the read/write bus (RWBUS) 241 in the second half of the clock CLK=4 is input to the output latch (RDO) 265 in the second half of the clock CLK=4, and is output to the 32:1 MUX 271 in the first half of the clock CLK=5. In the clock CLK=5, the 32:1 MUX 271 converts the read data of R0 output from the output latch 265 in the first half of the clock CLK=5 into a signal synchronized with H and L levels of the clock RWCLK having a ¹⁄₁₆ cycle of the clock CLK, and outputs the signal to the data I/O circuit 273. In the clock CLK=5, the data I/O circuit (DQ) 273 outputs the read data R0 output from the 32:1 MUX 271 to the CPU core CPU.

In the example shown in FIG. 12, since a command R0 of the clock CLK=0 and a command R0 of the clock CLK=4 for the bank 0 are read together, a read operation is performed by the normal read latency without a data collision in the I/O DQ of the data I/O circuit 273.

Figure 13:
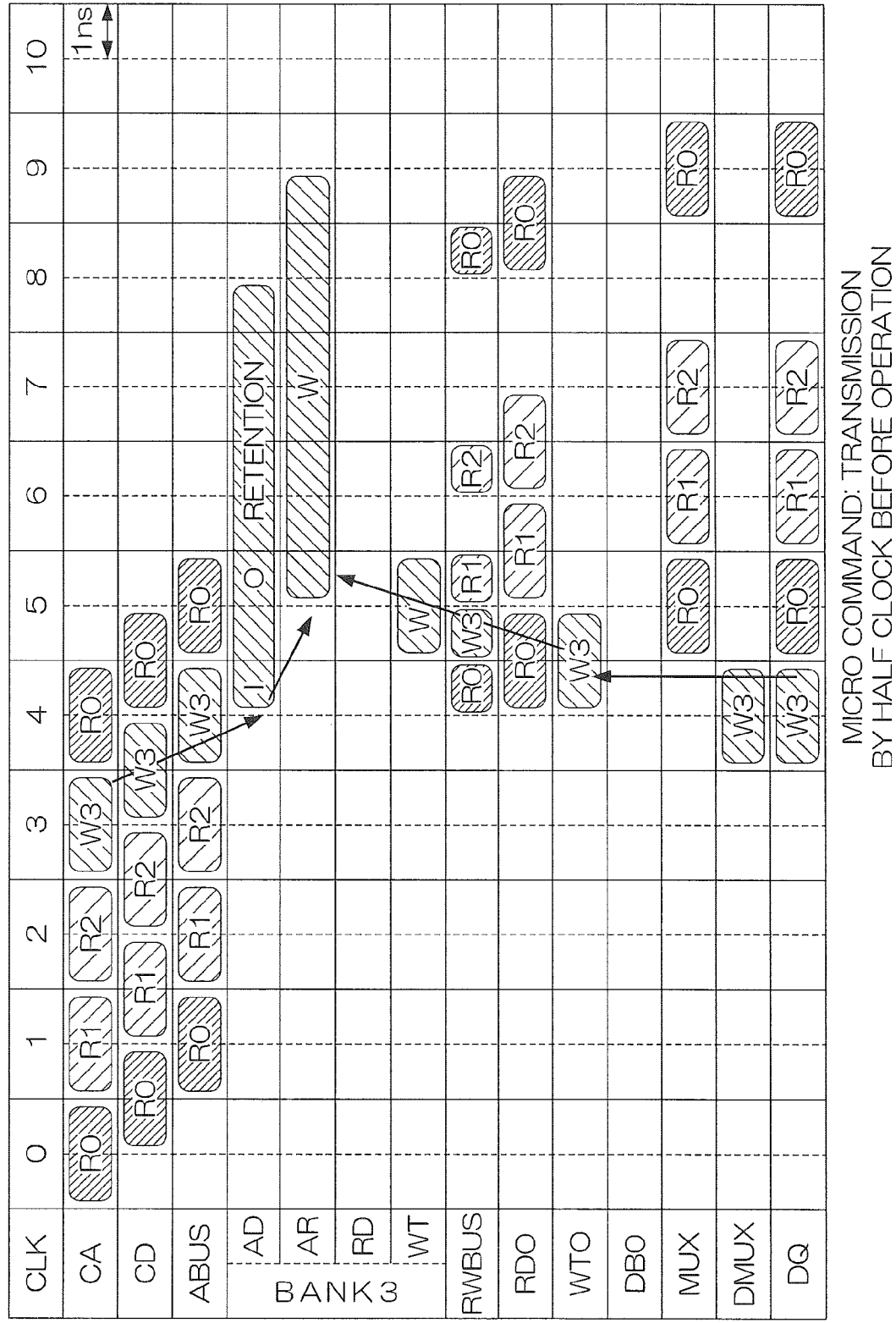
FIG. 13 is a timing chart illustrating the same timings of write operations to bank as the timings of operations of the DRAM core of FIG. 12.

FIG. 13 is a timing chart showing an operation part of the bank 3 in place of the bank 0 of the timing chart of FIG. 12. That is, an operation state (AD) of the address delay circuit 222 of the bank 3 (BANK3), an operation state (AR) of the memory array 221 of the bank 3, an operation state (RD) of the data output latch 237 of the bank 3, and an operation state (WT) of the data input latch 238 of the bank 3 are shown at the same timings in place of the operation state (AD) of the address delay circuit 222 of the bank 0 of FIG. 12, the operation state (AR) of the memory array 221 of the bank 0, the operation state (RD) of the data output latch 237 of the bank 0, and the operation state (WT) of the data input latch 238 of the bank 0.

As indicated by the arrow in the example shown in FIG. 13, in terms of W3 input to the command address input circuit (CA) 211 in the first half of the clock CLK=3, its command is input to the command decoder (CD) 213 in the second half of the clock CLK=3, and its address is output to the address bus (ABUS) 215 in the first half of the clock CLK=4. The address of W3 is input to the address delay circuit (AD) 222 in the second half of the clock CLK=4, is delayed by 1 CLK cycle, and is output from the address delay circuit (AD) 222 to the row decoder/column decoder 231 in the second half of the clock CLK=5. The output of the address delay circuit (AD) 222 is retained from the second half of the clock CLK=5 to the first half of the clock CLK=8.

On the other hand, write data W3 input to the data I/O circuit (DQ) 273 in the clock CLK=4 is input to the 1:32 DMUX 272, is converted from 1 signal into 32 signals, and is output to the input latch 266. The input latch (WTO) 266 receives an output W3 of the 1:32 DMUX 272 in the second half of the clock CLK=4, and outputs the output W3 to the read/write bus (RWBUS) 241 in the first half of the clock CLK=5. The data input latch (WT) 238 of the bank 3 receives the write data W3 on the read/write bus (RWBUS) 241 in the first half of the clock CLK=5, and outputs the write data W3 to the word line driver 234 in the second half of the clock CLK=5.

Next, the memory array (AR) 221 of the bank 3 performs a series of operations associated with the write operation from the second half of the clock CLK=5 to the first half of the clock CLK=9. The write data W3 input to the data I/O circuit (DQ) 273 in CLK=4 is written (W) to the memory array (AR) 221 of the bank 3 in the clock CLK=7.

Figure 14:
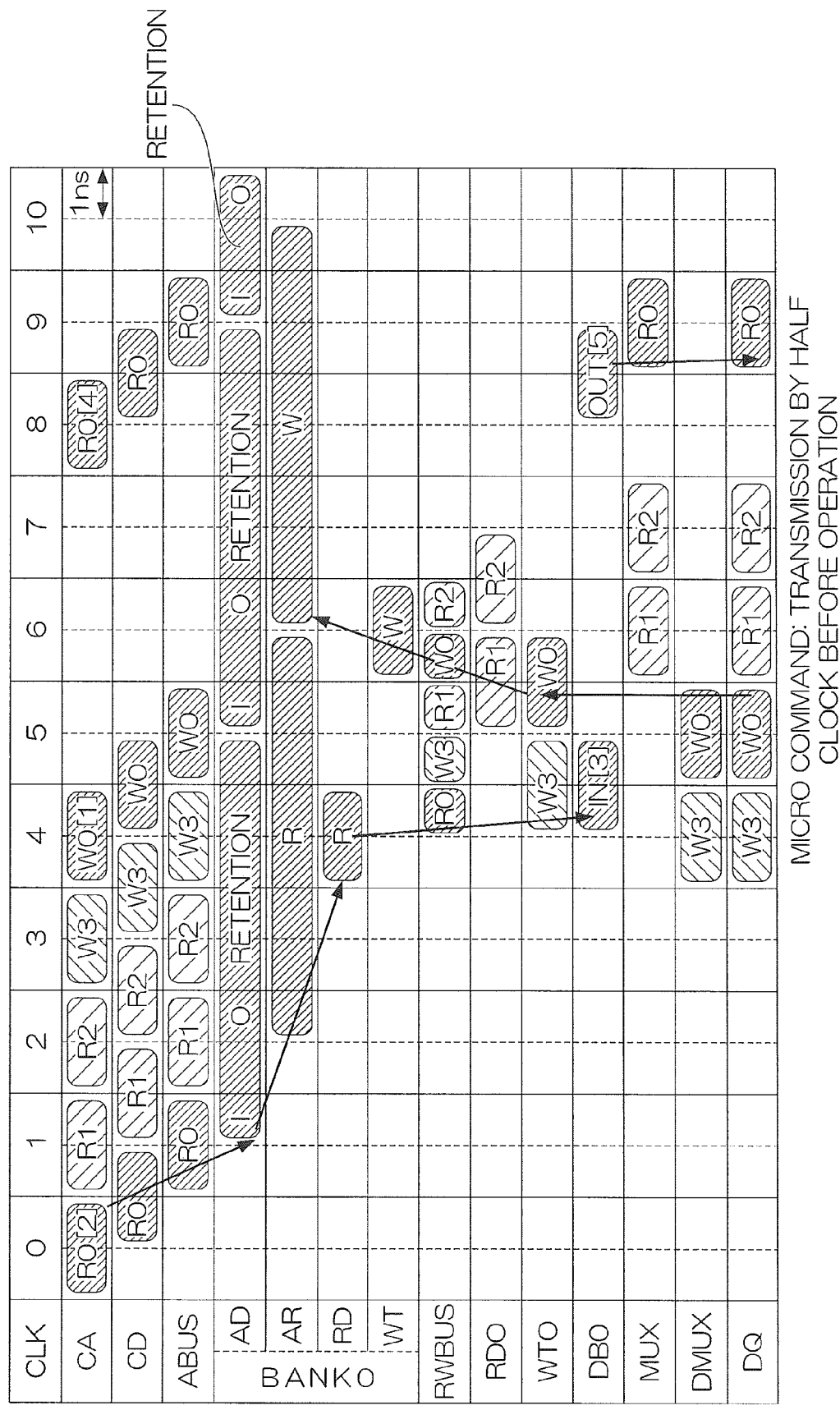
FIG. 14 is a timing chart illustrating other timings of operations of the DRAM core shown in FIG. 11.

Next, another example (a micro command (2) and the presence of a data collision at the write time) of operation timings of the configuration of FIG. 11 will be described with reference to FIG. 14. FIG. 14 shows operation timings of parts including operation timings of the bank 0 as in FIG. 12. In FIG. 14, R0 to R2 denote signals of a read command, a read address, read data, and the like for the banks 0 to 2, or circuit operations by the signals. W0 and W3 denote signals of a write command, a write address, write data, and the like directed to the banks 0 and 3 or circuit operations by the signals. Marks R, W, I, and O and Retention respectively represent operation states of a read operation, a write operation, an input operation, an output operation, and a retention operation. Marks IN and OUT respectively denote an input and an output in the delay buffer 0 (261). In a time when marks of R0 to R2, W0, W3, IN, OUT, and the like are not shown, the operation state is in high impedance in a circuit to which a high-impedance operation state is set.

In the example shown in FIG. 14, an input signal (CA) of the command address input circuit 211 is R0 in the clock CLK=0, R1 in CLK=1, R2 in CLK=2, W3 in CLK=3, W0 in CLK=4, and R0 in the clock CLK=8. An I/O signal (DQ) of the data I/O circuit 273 is W3 in the clock CLK=4 and W0 in the clock CLK=5. As indicated by the arrow, in terms of R0 input to the command address input circuit (CA) 211 in the first half of the clock CLK=0, its command is input to the command decoder (CD) 213 in the second half of the clock CLK=0, and its address is output to the address bus (ABUS) 215 in the first half of the clock CLK=1. The address of R0 is input to the address delay circuit (AD) 222 of the bank 0 in the second half of the clock CLK=1, is delayed by 1 CLK cycle, and is output from the address delay circuit (AD) 222 to the row decoder/column decoder 231 in the second half of the clock CLK=2. The output of the address delay circuit (AD) 222 is retained from the second half of the clock CLK=2 to the first half of the clock CLK=5.

The memory array (AR) 221 of the bank 0 performs a series of operations associated with the read operation from the second half of the clock CLK=2 to the first half of the clock CLK=6, and the data output latch (RD) 237 receives read data output from the main amplifier 233 in the first half of the clock CLK=4 and outputs the read data to the read/write bus (RW-BUS) 241 in the second half of the clock CLK=4. In this case, since a write command W0 is input to the bank 0 in the clock CLK=4, read data of R0 transmitted to the read/write bus (RWBUS) 241 in the second half of the clock CLK=4 is input to the delay buffer 0 (DB0) 261, not the output latch (RDO) 265, in the second half of the clock CLK=4.

In terms of W0 input to the command address input circuit (CA) 211 in the first half of the clock CLK=4, its command is input to the command decoder (CD) 213 in the second half of the clock CLK=4, and its address is output to the address bus (ABUS) 215 in the first half of the clock CLK=5. The address of W0 is input to the address delay circuit (AD) 222 of the bank 0 in the second half of the clock CLK=5, is delayed by 1 CLK cycle, and is output from the address delay circuit (AD) 222 to the row decoder/column decoder 231 in the second half of the clock CLK=6. The output of the address delay circuit (AD) 222 is retained from the second half of the clock CLK=6 to the first half of the clock CLK=9.

On the other hand, write data W0 input to the data I/O circuit (DQ) 273 in the clock CLK=5 is input to the 1:32 DMUX 272, is converted from 1 signal into 32 signals, and is output to the input latch 266. The input latch (WTO) 266 receives an output W0 of the 1:32 DMUX 272 in the second half of the clock CLK=5, and outputs the output W0 to the read/write bus (RWBUS) 241 in the first half of the clock CLK=6. The data input latch (WT) 238 of the bank 0 receives the write data W0 on the read/write bus (RWBUS) 241 in the first half of the clock CLK=6, and outputs the write data W0 to the word line driver 234 in the second half of the clock CLK=6.

Next, the memory array (AR) 221 of the bank 0 performs a series of operations associated with the write operation from the second half of the clock CLK=6 to the first half of the clock CLK=10. The write data W0 input to the data I/O circuit (DQ) 273 in CLK=5 is written (W) to the memory array (AR) 221 of the bank 0 in the clock CLK=8.

Since R0 is input to the command address input circuit (CA) 211 in the first half of the clock CLK=8, the delay buffer 0 (DB0) 261 outputs the retained read data R0 input in the second half of the clock CLK=4 to the 32:1 MUX 271 in the first half of the clock CLK=9. In the clock CLK=9, the 32:1 MUX 271 converts the read data R0 output from the delay buffer 0 (261) in the first half of the clock CLK=9 into a signal synchronized with H and L levels of the clock RWCLK having a 1/16 cycle of the clock CLK, and outputs the signal to the data I/O circuit 273. In the clock CLK=9, the data I/O circuit (DQ) 273 outputs the read data R0 output from the 32:1 MUX 271.

In the example shown in FIG. 14, if a write command W0 is input to the bank 0 in the clock CLK=4 as a control operation by the pipeline control circuit 214 (step [1]), a previous operation of the bank 0 is checked (step [2]). In this case, since the previous operation is the read operation, the previous operation is decided as a delay read operation. Next, in a half cycle after the write command W0 is input to the bank 0 in step [1], the delay buffer 0 (DB0) 261 is controlled to the input (IN) (step [3]). At this time, the output latch (RDO) 265 is controlled in the high impedance state. Thereafter, the write operation by the write command W0 is performed. Next, if the next read command R0 of the bank 0 is input in the clock CLK=8 (step [4]), the delay buffer 0 (DB0) 261 is controlled to the output (OUT) after a half cycle (step [5]).

Subsequently, if the write command W0 is also input to the bank 0 in the clock CLK=8, an operation of the write command W0 is performed in a state in which data within the delay buffer 0 (261) is retained. That is, the data within the delay buffer 0 (261) is retained until the next command of the bank 0 is a read command R0, and is output from the delay buffer in a half cycle after the read command is applied. That is, if the write command is continuous for a long time immediately after the read command is generated for the same bank, it waits a long time for the read command to be output. On the other hand, this can be prevented if the following command issue sequence is performed in correspondence therewith.

As a first method, if the CPU or controller knows that a continuous write operation is performed subsequent to the read command to a specific bank, previous read data is output once without inputting the command to the bank (NOP). In FIG. 10, this corresponds to the case where no command is input in CLK=4 after the read command R0 is input in CLK=0, and the write command is input in CLK=8. Since the bank 0 does not operate from the second half of CLK=6 to the first half of CLK=10 after read data 0 is output in CLK=5, data is not accumulated in the delay buffer even when the write command is input in CLK=8, and data is not retained even when the write operation is continuous.

As a second method, a data flash command DF is added to the DRAM core in correspondence with the case where the write operation is continuous after data is input to the delay buffer. If this command is input, no memory array operation is performed and data within the delay buffer is output in latency 1. In the operation, a data flash command DF0 is input in place of the read command R0 in CLK=12 in FIG. 10. In this case, the address bus ABUS does not operate in CLK=13 and the bank 0 does not operate from the second half of CLK=14 to the first half of CLK=18, and delay read data DR0 is output in CLK=13. Since no data is output in CLK=17, a normal continuous write operation can be resumed from CLK=16.

Next, the configuration and operation of a command/address bus part in the configuration shown in FIG. 11 will be described with reference to FIGS. 15A and 15B. FIG. 15A is a block diagram showing a circuit block 301 corresponding to a signal output circuit directed to the address bus (ABUS) 215 within the command address register 212 of FIG. 11 and a circuit block 321 corresponding to the address delay circuit 222 of FIG. 11. FIG. 15B is a timing chart illustrating the operations of the circuit block 301 and the circuit block 321.

The circuit block 301 includes a flip-flop 311 for a plurality of bits, which receives a command address signal CA (that is, a command signal and an address signal) of a plurality of bits input from the command address input circuit 211 of FIG. 11, a combination logic circuit 312, which receives an output of a plurality of bits of the flip-flop 311, and a flip-flop 313 for a plurality of bits, which receives an output of a plurality of bits of the logic circuit 312. An output of the flip-flop 313 is output to the address bus (ABUS) 215. In this case, the flip-flop 311 latches an input signal at the falling edge of the clock CLK, and the flip-flop 313 latches an input signal at the rising edge of the clock CLK. The flip-flop for the plurality of bits has a combination circuit of a plurality of flip-flops, which respectively receive data of a plurality of bits and has a common clock input. If description is not separately given, each flip-flop is configured as a D-type flip-flop. The logic circuit 312 has a function of decoding a bank address and deciding where or not a bank is activated, and a circuit for decoding a command and starting a pipeline control circuit to be shown later.

The circuit block 321 includes a flip-flop 331, a flip-flop 332 for a plurality of bits, a latch circuit 333, and an inverter 334 for a plurality of bits. Here, the inverter for a plurality of bits is a combination circuit of a plurality of inverters respectively corresponding to bits. The flip-flop 331 latches an input command AI<n> at the falling edge of the clock CLK and outputs a signal ICK<n>. Here, n of "<n>" indicates any one of Nos. 0 to 3 of the banks 0 to 3. The flip-flop 332 latches a signal of a plurality of bits on the address bus (ABUS) 215 at the rising edge of the signal ICK<n>, and outputs a signal AD<n> of a plurality of bits by inverting the signal. If an activation command ACT<n> has the H level at the falling edge of the clock CLK, an output ACK<n> of the latch circuit 333 is set to the H level, and is cleared to the L level after 4 CLK cycles.

If the signal ACK <n> has the H level, the inverter 334 receives and inverts the signal AD<n> of the plurality of bits and outputs a signal ADO of a plurality of bits. If the signal ACK<n> has the L level, an output of the inverter 334 is in the high-impedance state. This signal ADO is a signal to be input to the row decoder/column decoder (XDEC/YDEC) 231 of FIG. 11. The input command AI<n> and the activation command ACT<n> are signals input from the pipeline control circuit 214 of FIG. 11 for each bank in 1 CLK period. The input command AI<n> is a control signal for inputting a signal on the address bus (ABUS) 215 to the circuit block 321 (the address delay circuit 222 of FIG. 11) and retaining the signal. The activation command ACT<n> is a control signal for activating the AX/AY 232 of FIG. 11 by outputting the retained signal from the circuit block 321.

The timing chart of FIG. 15B respectively shows the waveforms of the clock CLK, a command address signal/chip select signal CA-CS, a chip select input signal CSI, the address bus signal ABUS, the input command AI<n>, the signal ICK <n>, the signal AD<n>, the activation command ACT<n>, the signal ACK<n>, and the signal ADO in order from the top. Also, "HZ" indicates that an output is in the high impedance state. In this case, the command address signal/chip select signal CA-CS and the chip select input signal CSI are input in the clock CLK=0, the input command AI<n> is input in the clock CLK=1 after 1 CLK period, and the activation command ACT<n> is input in the clock CLK=2 after 1 CLK period.

The command address signal CA input at the rising edge of the clock CLK=0 is latched by the flip-flop 311 at the falling edge of the clock CLK=0 (not shown). After a predetermined logic operation is performed by the logic circuit 312, the command address signal CA is latched by the flip-flop 313 at the rising edge of the next clock CLK=1, and is transmitted onto the address bus (ABUS) 215.

An input of the bank input command AI<n> which has a change to the H level; hereinafter, the same is true) is received at the falling edge of the clock CLK=1, and the output ICK<n> of the flip-flop 331 has the H level. The signal on the address bus (ABUS) 215 is latched and inverted by the flip-flop 332 at the rising edge of ICK<n>, and the signal AD<n> is output. The output of the flip-flop 332 is retained until the bank input command AI<n> is input the next time.

The input of the activation command ACT<n> is received at the falling edge of the clock CLK=2, and the output ACK<n> of the latch circuit 333 has the H level. If the signal ACK<n> has the H level, the signal ADO obtained by inverting the signal AD<n> is output from the inverter 334.

Next, the configuration and operation of a circuit part related to the read operation in the configuration shown in FIG. 11 will be described with reference to FIGS. 16A and 16B. FIG. 16A is a block diagram showing a circuit block 401 corresponding to the data output latch 237 of FIG. 11 and a circuit block 431 corresponding to the output latch 265 of FIG. 11. FIG. 16B is a timing chart illustrating the operations of the circuit block 401 and the circuit block 431.

The circuit block 401 includes a flip-flop 411 for a plurality of bits, which receives and inverts a main amplifier output MAO<n> output from the main amplifier 233 of FIG. 11 and outputs an inverted main amplifier output, an inverter 413 for a plurality of bits, which receives and inverts an inversion output of a plurality of bits of the flip-flop 411, and a flip-flop 412 having a reset function of receiving a read command RD<n> and outputting a signal RCK<n>. The output of the inverter 413 is output to the read/write bus (RWBUS) 241. In this case, the flip-flop 411 and the flip-flop 412 latch input signals at the falling edge of the clock CLK. If the signal RCK<n> output from the flip-flop 412 has the H level, the inverter 413 outputs a signal of a plurality of bits obtained by inverting the inversion output of the flip-flop 411.

As enclosed and shown in the rectangle of FIG. 16A, the flip-flop 412 includes a switch 421, which is turned on when the clock CLK is at the L level, a latch circuit having 1 set of inverters 422 and 423 in which an input and an output and an output and an input are connected to each other, a transistor 424, which pulls up the output of the inverter 422 to the H level when the clock CLK is at the H level, and an inverter 425, which inverts the output of the inverter 422. According to this configuration, the switch 421 is turned on when the clock CLK is at the L level, an input signal (D input) is inverted and latched, and the latched signal is further inverted and output by the inverter 425. On the other hand, when the clock CLK has the H level, the switch 421 is turned off and the transistor 424 is also turned on, so that the output of the inverter 422 is set to the H level and the output (Q output) of the inverter 425 is reset to the L level. In this configuration, the flip-flop 412 latches the read command RD<n> and outputs the signal RCK<n> at the falling edge of the clock CLK, and resets the signal RCK<n> to the L level at the rising edge of the clock CLK.

The circuit block 431 includes a flip-flop 441 for a plurality of bits, a flip-flop 442, and an inverter 443 for a plurality of bits. The flip-flop 441 latches and inverts a signal of a plurality of bits on the read/write bus (RWBUS) 241 at the rising edge of the clock CLK, and outputs the inverted signal of the plurality of bits. The flip-flop 442 latches a read command RDO at the rising edge of the clock CLK, and outputs a signal RCKO. The inverter 443 receives and inverts an inversion output of the flip-flop 441, and outputs a signal MUXI of a plurality of bits if the signal RCKO has the H level. The signal MUXI is a signal to be input to the 32:1 MUX 271 of FIG. 11. The read command RD<n> and the read command RDO are signals to be input from the pipeline control circuit 214 in 1 CLK period. The read command RD<n> is a control signal for outputting read data retained in the flip-flop 411 onto the read/write bus (RWBUS) 241. The read command RDO is a control signal for outputting the read data retained in the flip-flop 441 to the 32:1 MUX 271 of FIG. 11 via the inverter 443.

The timing chart of FIG. 16B respectively shows the operation states or waveforms of the clock CLK, the main amplifier output MAO<n>, the read command RD<n>, the signal RCK<n>, the read/write bus signal RWBUS, the read command RDO, the signal RCKO, and the signal MUXI in order from the top. In this case, a sense operation by the main amplifier 233 of FIG. 11 is terminated until the first half of the clock CLK=1, and the output of the main amplifier 233 is fixed in the first half of the clock CLK=1. In accordance with the operation of the main amplifier 233, the read command RD<n> is input at the rising edge of the clock CLK=1, and the read command RDO is input at the falling edge of the clock CLK=1 after a half CLK period.

An input of the read command RD<n> is received at the falling edge of the clock CLK=1, and the output RCK<n> of the flip-flop 412 has the H level. If the signal RCK<n> has the H level, a signal obtained by inverting the inversion output of the flip-flop 411 is output from the inverter 413. At this time, an output signal of the main amplifier 233 of FIG. 11 latched at the falling edge of the clock CLK=1 by the flip-flop 411 is output from the inverter 413 to the read/write bus (RWBUS) 241. Since the signal RCK<n> is cleared to be the L level at the rising edge of the clock CLK=2 after a half clock, the output of the inverter 413 is in the high-impedance state at this time.

At the rising edge of the clock CLK=2, an input of the read command RDO is received and the output RCKO of the flip-flop 442 has the H level. If the signal RCKO has the H level, a signal obtained by inverting the inversion output of the flip-flop 441 is output from the inverter 443. At this time, a latched signal of the signal on the read/write bus (RWBUS) 241 at the raising edge of the clock CLK=2 by the flip-flop 441, is output from the inverter 433 to the 32:1 MUX 271. Since the signal RCKO has the L level at the rising edge of the clock CLK=3, the output of the inverter 443 is in the high impedance state at this time.

Next, the configuration and operation of a circuit part related to the write operation in the configuration shown in FIG. 11 will be described with reference to FIGS. 17A and 17B. FIG. 17A is a block diagram showing a circuit block 501 corresponding to the input latch 266 of FIG. 11 and a circuit block 521 corresponding to the data input latch 238 of FIG. 11. FIG. 17B is a timing chart illustrating the operations of the circuit block 501 and the circuit block 521.

The circuit block 501 includes a flip-flop 511 for a plurality of bits, which receives a DMUXO signal output from the 1:32 DMUX 272 of FIG. 11, an inverter 513 for a plurality of bits, which receives an inversion output of a plurality of bits of the flip-flop 511, and a flip-flop 512 having a reset function of receiving the write command WTO and outputting a signal WCKO. An output of the inverter 513 is connected to the read/write bus (RWBUS) 241. In this case, the flip-flop 511 and the flip-flop 512 latch input signals at the rising edge of the clock CLK. The inverter 513 receives and inverts the inversion output signal of the flip-flop 511, and outputs a signal of a plurality of bits if the signal WCKO output from the flip-flop 512 has the H level. The flip-flop 512 has the same configuration as the flip-flop 412 shown in FIG. 16A.

The circuit block 521 includes a flip-flop 531 of a plurality of bits, a flip-flop 532, and an inverter 533 for a plurality of bits. The flip-flop 531 latches and inverts a signal of a plurality of bits on the read/write bus (RWBUS) 241 at the falling edge of the clock CLK, and outputs an inverted signal of a plurality of bits. The flip-flop 532 latches a write command WT<n> at the falling edge of the clock CLK, and outputs a signal WCK<n>. The inverter 521 receives and inverts an inversion output of the flip-flop 531, and outputs a signal WDI<n> of a plurality of bits if the signal WCK<n> has the H level. The signal WDI<n> is a signal to be input to the word line driver (WD) 234 of FIG. 11. The write command WTO and the write command WT<n> are signals input from the pipeline control circuit 214 of FIG. 11 in 1 CLK period. The write command WTO is a control signal for outputting write data retained in the flip-flop 511 onto the read/write bus (RWBUS) 241. The write command WT<n> is a control signal for outputting write data retained in the flip-flop 531 to the word line driver 234 of FIG. 11 via the inverter 533.

The timing chart of FIG. 17B respectively shows the operation states or waveforms of the clock CLK, the output DMUXO of the 1:32 DMUX 272, the write command WTO, the signal WCKO, the read/write bus signal RWBUS, the write command WT<n>, the signal WCK<n>, and the signal WDI<n> in order from the top. In this case, write data from the 1:32 DMUX 272 is input as the signal DMUXO in the clock CLK=0. The write command WTO is input at the falling edge of the clock CLK=0, and the write command WT<n> is input at the rising edge of the clock CLK=1 after a half CLK.

At the rising edge of the clock CLK=1, an input of the write command WTO is received, and the output WCKO of the flip-flop 512 has the H level. If the signal WCKO has the H level, a signal obtained by inverting the inversion output of the flip-flop 511 is output from the inverter 513. At this time, an output signal of the 1:32 DMUX 272 latched at the rising edge of the clock CLK=1 by the flip-flop 511 is output from the inverter 513 to the read/write bus (RWBUS) 241. Since the signal WCKO is cleared to be the L level at the falling edge of the clock CLK=1 after a half clock, the output of the inverter 513 is in the high impedance state at this time.

At the falling edge of the clock CLK=1, an input of the write command WT<n> is received and the output WCK<n> of the flip-flop 532 has the H level. If the signal WCK<n> has the H level, a signal obtained by inverting the inversion output of the flip-flop 531 is output from the inverter 533. At this time, a latched signal of the signal on the read/write bus (RWBUS) 241 at the falling edge of the clock CLK=1 by the flip-flop 531, is output from the inverter 533 to the word line driver 234. Since the signal WCK<n> has the L level at the falling edge of the clock CLK=2, the output of the inverter 533 is in the high-impedance state at this time.

Next, the configuration and operation of the delay buffers 0 to 3 (261 to 264) shown in FIG. 11 (as a delay buffer 621 shown in FIGS. 18A and 18B) will be described with reference to FIGS. 18A and 18B. The same elements as shown in FIG. 16A are denoted by the same reference numerals, and description thereof is omitted.

Figure 18A:
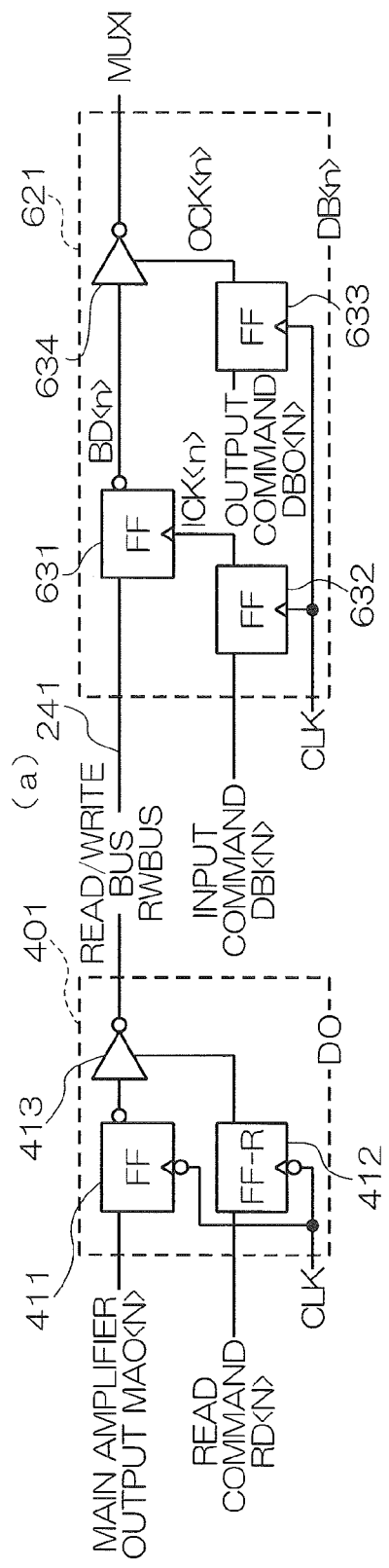
FIG. 18A is a block diagram illustrating configurations of delay buffers shown in FIG. 11.

FIG. 18A is a block diagram showing the circuit block 401 (having the same configuration as the circuit block 401 of FIG. 16A) corresponding to the data output latch 237 of FIG. 11 and the circuit block 621 corresponding to the delay buffers 0 to 3 (261 to 264) of FIG. 11. FIG. 18B is a timing chart illustrating the operation of the circuit block 621.

The circuit block 621 includes a flip-flop 631 for a plurality of bits, flip-flops 632 and 633, and an inverter 634 for a plurality of bits. The flip-flop 632 latches an input command DBI<n> at the rising edge of the clock CLK and outputs a signal ICK<n>. The flip-flop 631 latches and inverts a signal of a plurality of bits on the read/write address bus (RWBUS) 241 at the rising edge of the signal ICK<n>, and outputs a signal BD<n> of a plurality of bits. The flip-flop 633 latches an output command DBO<n> at the rising edge of the clock CLK, and outputs a signal OCK<n>. The inverter 634 receives and inverts the signal BD<n> of the plurality of bits, and outputs a signal MUXI of a plurality of bits if the signal OCK<n> has the H level. The signal MUXI is a signal to be input to the 32:1 MUX 271 of FIG. 11. The input command DBI<n> and the output command DBO<n> are signals input from the pipeline control circuit 214 for each bank in 1 CLK period. The input command DBI<n> is a control signal for latching read data on the read/write bus (RWBUS) 241 in the flip/flop 631. The output command DBO<n> is a control signal for outputting the read data retained in the flip-flop 631 to the 32:1 MUX 271 of FIG. 11 via the inverter 634.

Figure 18B:
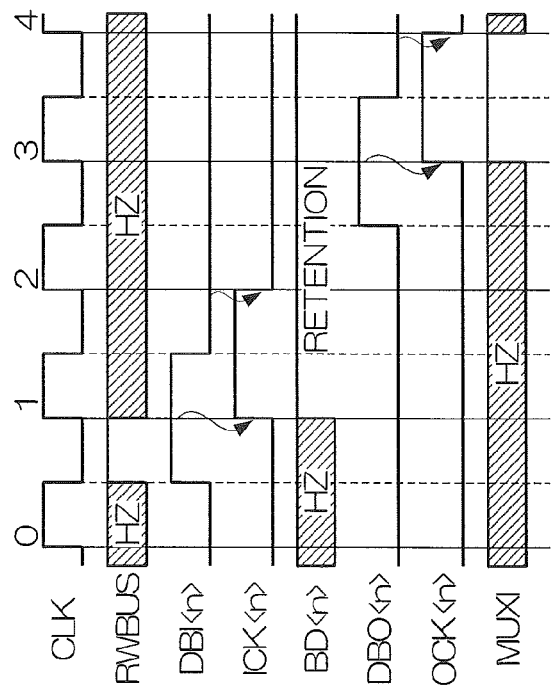
FIG. 18B is a timing chart illustrating timings of operations of delay buffers shown in FIG. 11.

The timing chart of FIG. 18B respectively shows the operation states or waveforms of the clock CLK, the read/write bus signal RWBUS, the input command DBI<n>, the signal ICK<n>, the signal BD<n>, the output command DBO<n>, the signal OCK<n>, and the signal MUXI in order from the top. In this case, it is assumed that read data from the inverter 413 is output onto the read/write bus (RWBUS) 241 in the second half of the clock CLK=0. It is assumed that the input command DBI<n> is input at the falling edge of the clock CLK=0, and the output command DBO<n> is input at the falling edge of the clock CLK=2.

At the rising edge of the clock CLK=1, an input of the input command DBI<n> is received, and the output ICK<n> of the flip-flop 632 has the H level. If the signal ICK<n> has the H level, a signal on the read/write bus (RWBUS) 241 is latched by the flip-flop 631, and an output signal obtained by inverting the signal is output as the signal BD<n>. This signal BD<n> is retained at the same value until the output ICK<n> has the H level the next time.

At the rising edge of the clock CLK=3, an input of the output command DBO<n> is received and the output OCK<n> of the flip-flop 633 has the H level. If the signal OCK<n> has the H level, a signal obtained by inverting the signal BD<n> is output from the inverter 634. Since the signal OCK<n> has the L level at the rising edge of the clock CLK=4 after 1 clock, the output of the inverter 634 is in the high-impedance state at this time.

Figure 19:
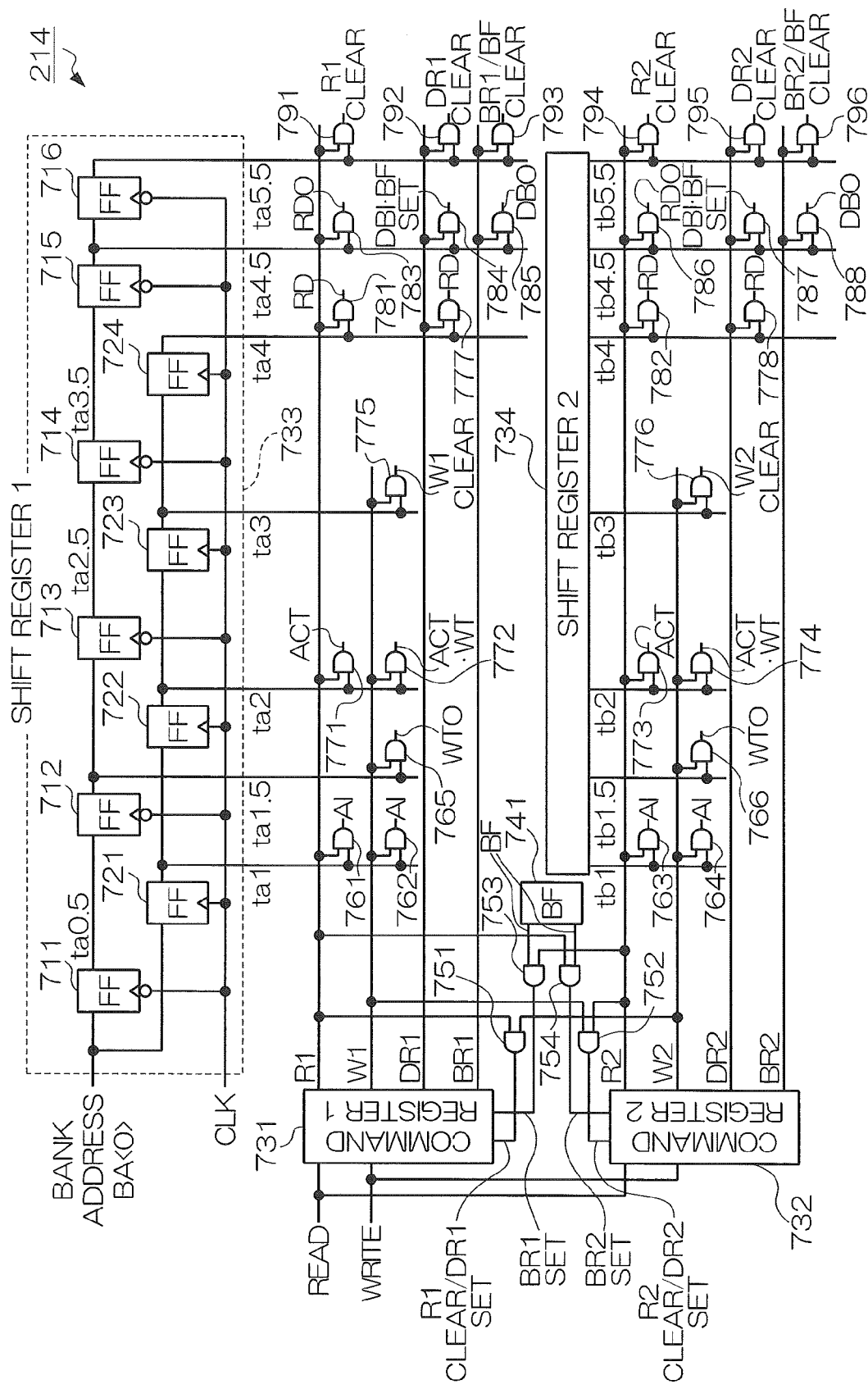
FIG. 19 is a block diagram illustrating configurations of pipeline control circuit shown in FIG. 11.

Next, the configuration and operation of the pipeline control circuit 214 shown in FIG. 11 will be described with reference to FIGS. 19 to 22. FIG. 19 shows a part corresponding to a bank 0 in the pipeline control circuit 214. In the pipeline control circuit 214, the same independent control circuits corresponding to the other banks 1 to 3 are provided. The configuration for the bank 0 shown in FIG. 19 includes a shift register 1 (733) having flip-flops 711 to 716 and flip-flops 721 to 724, a shift register 2 (734) of the same configuration, a command register 1 (731), a command register 2 (732), a buffer flag register 741, 2-input AND circuits 751 to 754, 2-input AND circuits 761 to 766, 2-input AND circuits 771 to 778, 2-input AND circuits 781 to 788, and 2-input AND circuits 791 to 796. Hereinafter, the 2-input AND circuit is simply referred to as the AND circuit.

The flip-flops 711 to 716 included in the shift register 1 (733) are 6 flip-flops, which are connected in series to each other and latch input signals at the falling edge of the clock CLK. A bank address signal BA<0> is input to an input of the flip-flop 711. The flip-flops 721 to 724 are 4 flip-flops, which are connected in series to each other and latch input signals at the rising edge of the clock CLK. The bank address signal BA<0> is input to an input of the flip-flop 721. If the read or write command for the bank 0 is input, the bank address signal BA<0> has the H level at the rising edge of the clock CLK and is a signal at which the H level is maintained for 1 clock period. Accordingly, an output signal ta0.5 of the flip-flop 711 has the H level at the falling edge of the clock after the bank address signal BA<0> has the H level, and has the H level in 1 clock period therefrom. If the 1 CLK period is denoted by 1T and a half clock period is denoted by 0.5T, an output signal ta0.5 of the flip-flop 711 is a signal having the H level in T0.5 by setting a time when the bank address signal BA<0> (referred to as a bank<0> signal in FIGS. 20 to 22) has the H level as a reference T0. Likewise, outputs ta1.5, ta4.5, and ta5.5 of the flip-flops 712, 715, and 716 respectively have the H level in T1.5, T4.5, and T5.5, and have the L level after 1 clock period, as shown in FIG. 21. On the other hand, since the flip-flops 721 to 724 latch input signals at the rising edge of the clock CLK, outputs ta1, ta2, ta3, and ta4 of the flip-flops 721 to 724 respectively have the H level in T1, T2, T3, and T4, and have the L level after 1 clock period, as shown in FIG. 21. The shift register 2 (734) also performs the same operation, and outputs tb1, tb1.5, tb2, tb3, tb4, tb4.5, and tb5.5 have the H level in T1, T1.5, T2, T3, T4, T4.5, and T5.5 after the bank address BA<0> is input to the shift register 2 (734), and have the L level after 1 clock period.

If a read or write command READ or WRITE is issued to the bank 0, the command register 1 (731) and the command register 2 (732) are circuits that retain and output a plurality of types of control signals corresponding to the commands. The plurality of types of control signals to be retained/output by the command register 1 (731) are a signal R1, a signal W1, a signal DR1, and a signal BR1. The plurality of types of control signals to be retained/output by the command register 2 (732) are a signal R2, a signal W2, a signal DR2, and a signal BR2. However, the signals R1 and R2 do not correspond to the marks R1 and R2 used as marks indicating command signals, address signals, data signals, or operation states when the read or write operation for each bank in the timing charts of FIG. 10 and the like is described. The command register 1 (731) and the command register 2 (732) are alternately selected and used for the read or write command READ or WRITE for the bank 0 (that is, at an interval of 1 slot of the pipeline operation). Likewise, the shift register 1 (733) and the shift register 2 (734) are alternately selected for the read or write command READ or WRITE for the bank 0. For example, in terms of this alternate selection, a 1-bit flag register is prepared and a flag value is inverted every time when the bank address signal BA<0> has the H level. The command register 1 (731) can be selected if the flag value is the H level, and the command register 2 (732) can be selected if the flag value is the L level. However, this is exemplary, and other methods may be possible.

A READ signal indicating that the read command is issued to the bank 0 and a WRITE signal indicating that the write command is issued to the bank 0 are commonly input to the command register 1 (731) and the command register 2 (732). Signals such as an R1 clear/DR1 set signal, and a BR1 set signal are input to the command register 1 (731). Signals such as an R2 clear/DR2 set signal and a BR2 set signal are input to the command register 2 (732).

The signal R1 is set when the READ signal is input, and is cleared when the R1 clear signal, which is an output of the AND circuit 791, is input or when the R1 clear/DR1 set signal, which is an output of the AND circuit 751, is input. Here, a level of the set signal is the H level and a level of the clear signal is the L level (hereinafter, the same is true). The signal W1 is set when the WRITE signal is input, and is cleared when the W1 clear signal, which is an output of the AND circuit 755, is input. The signal DR1 is set when the R1 clear/DR1 set signal, which is the output of the AND circuit 751, is input, and is cleared when the DR1 clear signal, which is an output of the AND circuit 792, is input. The signal BR1 is set when the BR1 set signal, which is an output of the AND circuit 753, is input, and is cleared when the BR1/BF clear signal, which is an output of the AND circuit 793, is input.

The signal R2 is set when the READ signal is input, and is cleared when the R2 clear signal, which is an output of the AND circuit 794, is input or when the R2 clear/DR2 set signal, which is an output of the AND circuit 752, is input. The signal W2 is set when the WRITE signal is input, and is cleared when the W2 clear signal, which is an output of the AND circuit 776, is input. The signal DR2 is set when the R2 clear/DR2 set signal, which is the output of the AND circuit 752, is input, and is cleared when the DR2 clear signal, which is an output of the AND circuit 795, is input. The signal BR2 is set when the BR2 set signal, which is an output of the AND circuit 754, is input, and is cleared when the BR2/BF clear signal, which is an output of the AND circuit 796, is input.

The signal R1 and the signal W2 are input to the AND circuit 751, which outputs the R1 clear/DR1 set signal. That is, if the signal R1 has the H level and the signal W2 has the H level, the R1 clear/DR1 set signal is output (and has the H level; hereinafter, the same is true). The signal R2 and the signal W1 are input to the AND circuit 752, which outputs the R2 clear/DR2 set signal. That is, if the signal R2 has the H level and the signal W1 has the H level, the R2 clear/DR2 set signal is output (and has the H level).

The signal R2 and an output signal BF of the buffer flag register 741 are input to the AND circuit 753, which outputs the BR1 set signal. Accordingly, if the signal R2 has the H level and the signal BF has the H level, the BR1 set signal is output. The buffer flag register 741 is a circuit that outputs the output signal BF (H level) indicating a state in which read data is input to the delay buffer 621 of FIG. 18A (that is, the delay buffer 0 (261) of FIG. 11) and is retained to the AND circuits 753 and 754. This signal BF is set when the DBI/BF set signal, which is an output of the AND circuit 784, is input or when the DBI/BF set signal, which is an output of the AND circuit 787, is input. The signal BF is cleared when the BR1/BF clear signal, which is the output of the AND circuit 793, is input or when the BR2/BF clear signal, which is the output of the AND circuit 796, is input.

The signal R1 and the signal BF are input to the AND circuit 754, which outputs the BR2 set signal. Accordingly, if the signal R1 has the H level and the signal BF has the H level, the BR2 set signal is output.

The AND circuits 761 and 762 respectively have one inputs connected to the signal ta1, and have the other inputs connected to the signal R1 and the signal W1. The AND circuits 763 and 764 have one inputs connected to the signal tb1 and the other inputs connected to the signal R2 and the signal W2. The outputs of the AND circuits 761 to 764 are signals AI (signals corresponding to the input command AI<n> of FIGS. 15A and 15B (where n=0)). Accurately, a signal obtained by performing an OR operation on 4 outputs AI of the AND circuits 761 to 764 is a signal corresponding to an input command AI<n> of FIGS. 15A and 15B (where n=0) (hereinafter, the same is true).

The AND circuit 765 has one input connected to the signal ta1.5 and the other input connected to the signal W1. The AND circuit 766 has one input connected to a signal tb1.5 and the other input connected to the signal W2. The outputs of the AND circuits 765 and 766 are signals WTO (signals corresponding to the write command WTO of FIGS. 17A and 17B).

The AND circuit 771 has one input connected to the signal ta2 and the other input connected to the signal R1. The AND circuit 773 has one input connected to the signal tb2 and the other input connected to the signal R2. The outputs of the AND circuits 771 and 773 are signals ACT (signals corresponding to the activation command ACT<n> of FIGS. 15A and 15B (where n=0)). The AND circuit 772 has one input connected to the signal ta2 and the other input connected to the signal W1. The AND circuit 774 has one input connected to the signal tb2 and the other input connected to the signal W2. The outputs (the signals ACT/WT) of the AND circuits 772 and 774 are the signal ACT (a signal corresponding to the activation command ACT<n> (where n=0) of FIGS. 15A and 15B) and the signal WT (a signal corresponding to the write command WT<n> (where n=0) of FIGS. 17A and 17B).

The AND circuit 775 or 776, which outputs the W1 or W2 clear signal has one input connected to the signal ta3 or tb3 and the other input connected to the signal W1 or W2.

The inputs of the AND circuit 781 are connected to the signal ta4 and the signal R1. The inputs of the AND circuit 782 are connected to the signal tb4 and the signal R2. The inputs of the AND circuit 777 are connected to the signal ta4 and the signal DR1. The inputs of the AND circuit 778 are connected to the signal tb4 and the signal DR2. The outputs of the AND circuits 781, 782, 777, and 778 are signals RD. The RD signal is a signal corresponding to the read command RD<n> (where n=0) of FIGS. 16A, 16B, 18A, and 18B.

The inputs of the AND circuit 783 are connected to the signal ta4.5 and the signal R1. The inputs of the AND circuit 786 are connected to the signal tb4.5 and the signal R2. The outputs of the AND circuits 783 and 786 are signals RDO (signals corresponding to the read command RDO of FIGS. 16A and 16B). The AND circuits 784 and 787, which output the DBI/BF set signals, have one input connected to the signal ta4.5 or the signal tb4.5 and the other input connected to the signal DR1 or the signal DR2. The DBI/BF set signal is a signal to be input to the buffer flag register 741 and also is a signal corresponding to the input command DBI<n> (where n=0) of FIGS. 18A and 18B. The AND circuits 785 and 788 respectively have one input connected to the signal ta4.5 or the signal tb4.5 and the other input connected to the signal BR1 or the signal BR2. The outputs of the AND circuits 785 and 788 are signals DBO (signals corresponding to the output command DBO<n> (where n=0) of FIGS. 18A and 18B).

The inputs of the AND circuit 791, which outputs the R1 clear signal, are connected to the signal ta5.5 and the signal R1. The inputs of the AND circuit 794, which outputs the R2 clear signal, are connected to the signal tb5.5 and the signal R2. The AND circuit 792 or 795, which outputs the DR1 or DR2 clear signal, has one input connected to the signal ta5.5 or the signal tb5.5 and the other input connected to the signal DR1 or the signal DR2. The AND circuit 793 or 796, which outputs the BR1/BF or BR2/BF clear signal, has one input connected to the signal ta5.5 or the signal tb5.5 and the other input connected to the signal BR1 or the signal BR2.

Figure 20A:
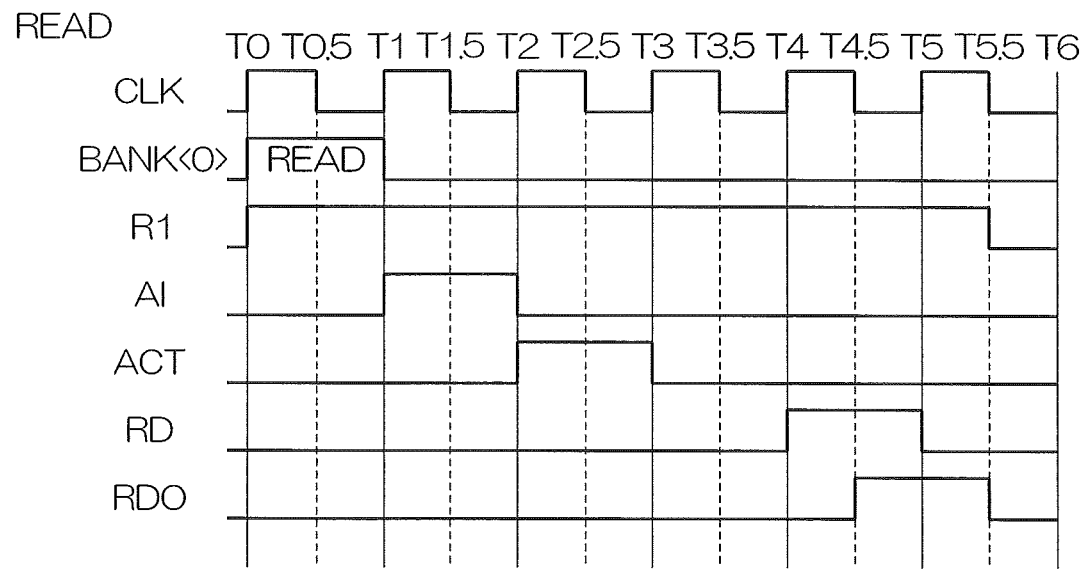
FIG. 20A is a timing chart diagram illustrating timings of read operations of the pipeline control circuit shown in FIG. 19.

FIG. 20A is a timing chart showing an example (without a read/write collision) of operation waveforms of the pipeline control circuit of FIG. 19 when a read command is issued to the bank 0. In FIG. 20A, there are shown the waveforms (or operation states) of the clock CLK, the read command READ for Bank<0>, the signal R1, the signal AI, the signal ACT, the signal RD, and the signal RDO in order from the top. FIG. 20A shows a signal change from T0 to T6 by setting T0 to a rising-edge time of the clock CLK at which the read command READ is issued, setting 1 CLK period to 1T, and setting its half to 0.5T. If the read command READ for Bank<0> is input in T0, the READ signal has the H level in the 1T period, so that the signal R1 output from the command register 1 (731) is set to have the H level. The signal R1 is cleared to the L level by the R1 clear signal output from the AND circuit 791 in T5.5. The signal AI is output from the AND circuit 761 in a period of T1 to T2 by the signal R1 having the H level. Likewise, the signal ACT is output from the AND circuit 771 in a period of T2 to T3. Likewise, the signal RD is output from an RD signal generation circuit 801 in a period of T4 to T5 since the RD set signal of the output of the AND circuit 781 has the H level (and thereafter the output (the RD clear signal) of the flip-flop 725 has the H level in T5). Likewise, the signal RDO is output from the AND circuit 783 in a period of T4.5 to T5.5.

Figure 20B:
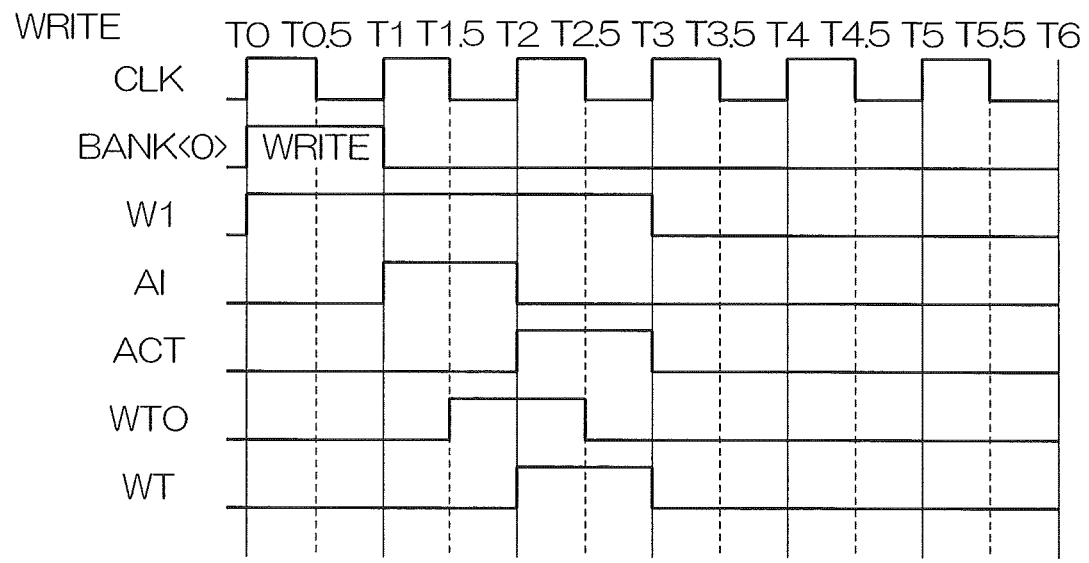
FIG. 20B is a timing chart illustrating timings of write operations of the pipeline control circuit shown in FIG. 19.

FIG. 20B is a timing chart showing an example (without the read/write collision) of the operation waveforms of the pipeline control circuit of FIG. 19 when the write command is issued to the bank 0. In FIG. 20B, there are shown the waveforms (or operation states) of the clock CLK, the write command WRITE for Bank<0>, the signal W1, the signal AI, the signal ACT, the signal WTO, and the signal WT in order from the top. If the write command WRITE for Bank<0> is input, the WRITE signal has the H level in the 1T period, so that the signal W1 output from the command register 1 (731) is set to have the H level. The signal W1 is cleared to the L level by the W1 clear signal output from the AND circuit 775 in T3. The signal AI is output from the AND circuit 762 in a period of T1 to T2 by the signal W1, which has the H level. Likewise, the signal WTO is output from the AND circuit 765 in a period of T1.5 to T2.5. Likewise, the signal ACT/WT (which is divided into the signal ACT and the signal WT in FIGS. 20B and 22) is output from the AND circuit 772 in a period of T2 to T3.

Figure 22:
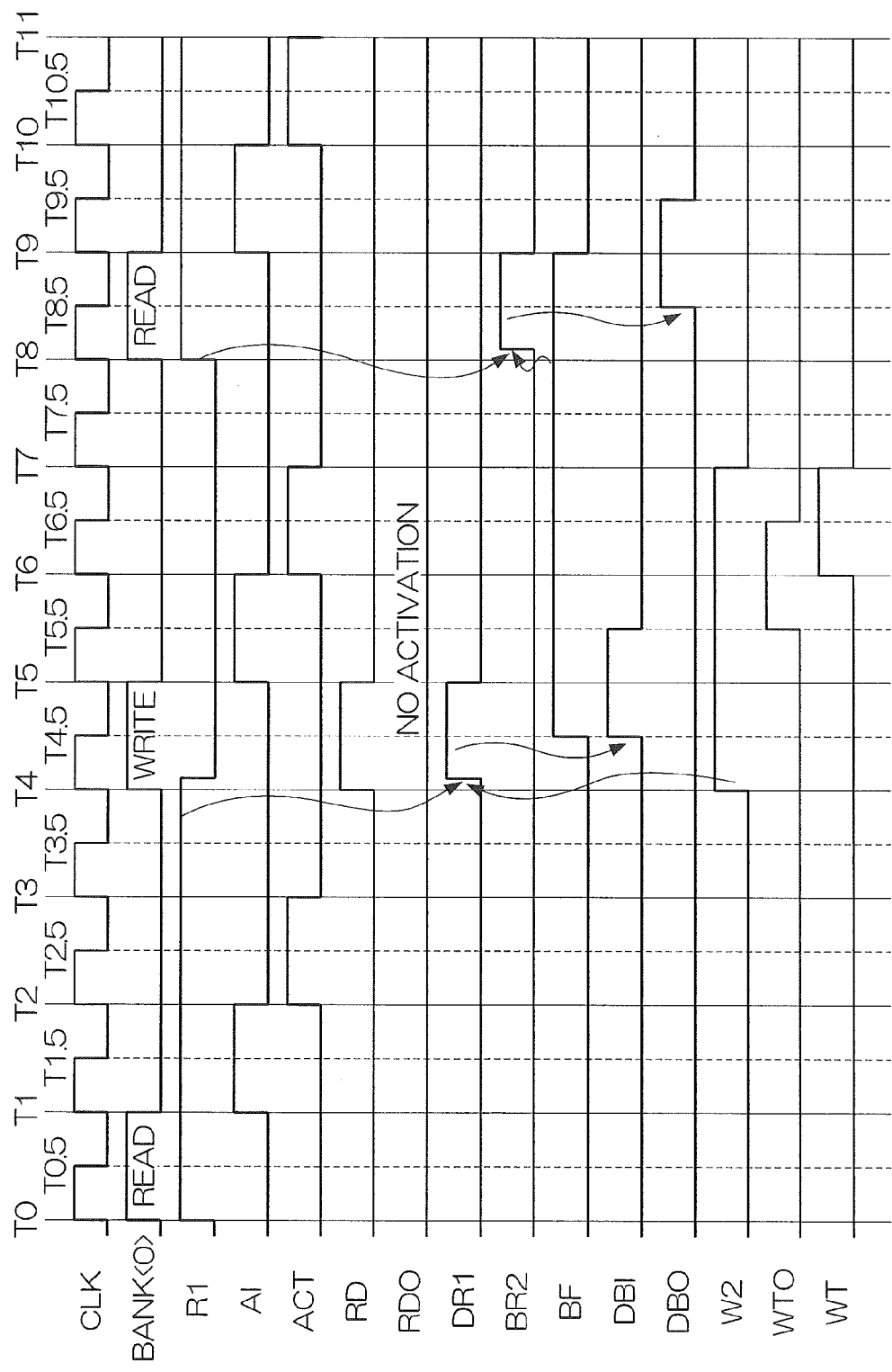
FIG. 22 is a timing chart illustrating a second half of timings of the other operations of the pipeline control circuit shown in FIG. 19.

FIGS. 21 and 22 are timing charts showing an example (having the read/write collision) of the operation waveforms of the pipeline control circuit of FIG. 19 when the read command, the write command, and the read command are continuously issued to the bank 0. FIGS. 21 and 22 are 2 figures into which a waveform change is divided in the same time. In FIG. 21, there are shown the output waveforms (or operation states) of the clock CLK, the command for Bank<0>, ta1, ta1.5, ta2, ta3, ta4, ta4.5, ta5.5, tb1, tb1.5, tb2, tb3, tb4, tb4.5, and tb5.5 in order from the top. In FIG. 22, there are shown the waveforms (or operation states) of the clock CLK, the command for Bank<0>, the signal R1, the signal AI, the signal ACT, the signal RD, the signal RDO, the signal DR1, the signal BR2, the signal BF, the signal DBI, the signal DBO, the signal W2, the signal WTO, and the signal WT. Among these, the clock CLK and the command for Bank<0> are the same in the two figures. In the examples shown in FIGS. 21 and 22, the read command READ for the bank 0 is issued in T0 to T1, the write command WRITE for the bank 0 is issued in T4 to T5 as the next slot, and the read command READ for the bank 0 is issued in T8 to T9 as the next slot.

In this case, the READ signal based on the read command of T0 to T1 is input (received) to the command register 1 (731). The WRITE signal based on the write command of T4 to T5 is input to the command register 2 (732), and the READ signal based on the read command of T8 to T9 is input to the command register 1 (731).

FIGS. 21 and 22 show signal changes from T0 to T11 by setting T0 to a rising-edge time of the clock CLK at which a first read command READ is issued, setting 1 CLK period to 1T, and setting its half to 0.5T. The signal ta1 is the H signal in T1 and T9 (respectively having a period of 1T; hereinafter, the same is true). The signal ta1.5 is the H signal in T1.5 and T9.5. The signal ta2 is the H signal in T2 and T10. The signal ta3 is the H signal in T3. The signal ta4 is the H signal in T4. The signal ta4.5 is the H signal in T4.5. The signal ta5.5 is the H signal in T5.5. The signal tb1.5 is the H signal in T5.5. The signal tb2 is the H signal in T6. The signal tb3 is the H signal in T7. The signal tb4 is the H signal in T8. The signal tb4.5 is the H signal in T8.5. The signal tb5.5 is the H signal in T9.

If the first read command READ for Bank<0> is input in T0 to T1, the READ signal has the H level in a 1T period, so that the signal R1 output from the command register 1 (731) has the H level in T0.

Next, since the signal R1 has the H level in T1, the signal AI is output from the AND circuit 761 in the 1T period.

Next, since the signal R1 has the H level in T2, the signal ACT is output from the AND circuit 771 in the 1T period.

Thereafter, if the write command WRITE for Bank<0> is input in T4 to T5, the WRITE signal has the H level in the 1T period, so that the signal W2 output from the command register 2 (732) has the H level. Since the signal R1 has the H level in T4, the signal RD is output from the AND circuit 781 in the period of T4 to T5.

If the signal W2 has the H level in T4, the signal R1 has the H level, so that the R1 clear/DR1 set signal is output from the AND circuit 751. The R1 clear/DR1 set signal is input to the command register 1 (731), the signal R1, which is the output of the command register 1 (731), is cleared to be the L level in response thereto, and the signal DR1 is set to have the H level.

Next, since the signal DR1 has the H level in T4.5, the DBI/BF set signal is output from the AND circuit 784 in the 1T period. The DBI/BF set signal is input to the buffer flag register 741, and the output signal BF of the buffer flag register 741 is set to have the H level.

Next, since the signal W2 has the H level in T5, the signal AI is output from the AND circuit 764 in the 1T period. Since the signal R1 has the H level, the DR1 clear signal is output from the AND circuit 791. The DR1 clear signal is input to the command register 1 (731), and the signal DR1, which is the output of the command register 1 (731), is cleared to have the L level in response thereto.

Next, since the signal W2 has the H level in T5.5, the signal WTO is output from the AND circuit 766 in the 1T period.

Next, since the signal W2 has the H level in T6, the signal ACT/WT is output from the AND circuit 774 in the 1T period. Since the signal ACT/WT is used as the signal ACT and the signal WT, the signal ACT and the signal WT all have the H level in a period of T6 to T7 in FIG. 22.

Next, since the signal W2 has the H level in T7, the W2 clear signal is output from the AND circuit 776. The W2 clear signal is input to the command register 2 (732), and the signal W2, which is the output of the command register 2 (732), is cleared to have the L level in response thereto.

Next, since a second read command READ for Bank<0> in T8 to T9 is input in T8, the READ signal has the H level in the 1T period and the signal R1 output from the command register 1 (731) has the H level.

Next, since the signal BR2 has the H level in T8.5 and the H-level signal is output from the flip-flop 715 in the 1T period, the signal DBO is output from the AND circuit 788 in the 1T period.

Next, since the signal R1 has the H level in T9, the signal AI is output from the AND circuit 761 in the 1T period. Since the H-level signal is output from the flip-flop 725 in the 1T period, the BR2/BF clear signal is output from the AND circuit 796. The BR2/BF clear signal is input to the buffer flag register 741, and the output signal BF of the buffer flag register 741 is cleared to have the L level. The BR2/BF clear signal is input to the command register 2 (732), and the signal BR2, which is the output of the command register 2 (732), is cleared to have the L level in response thereto.

Next, since the signal R1 has the H level in T10, the signal ACT is output from the AND circuit 771 in the 1T period.

Figure 24:
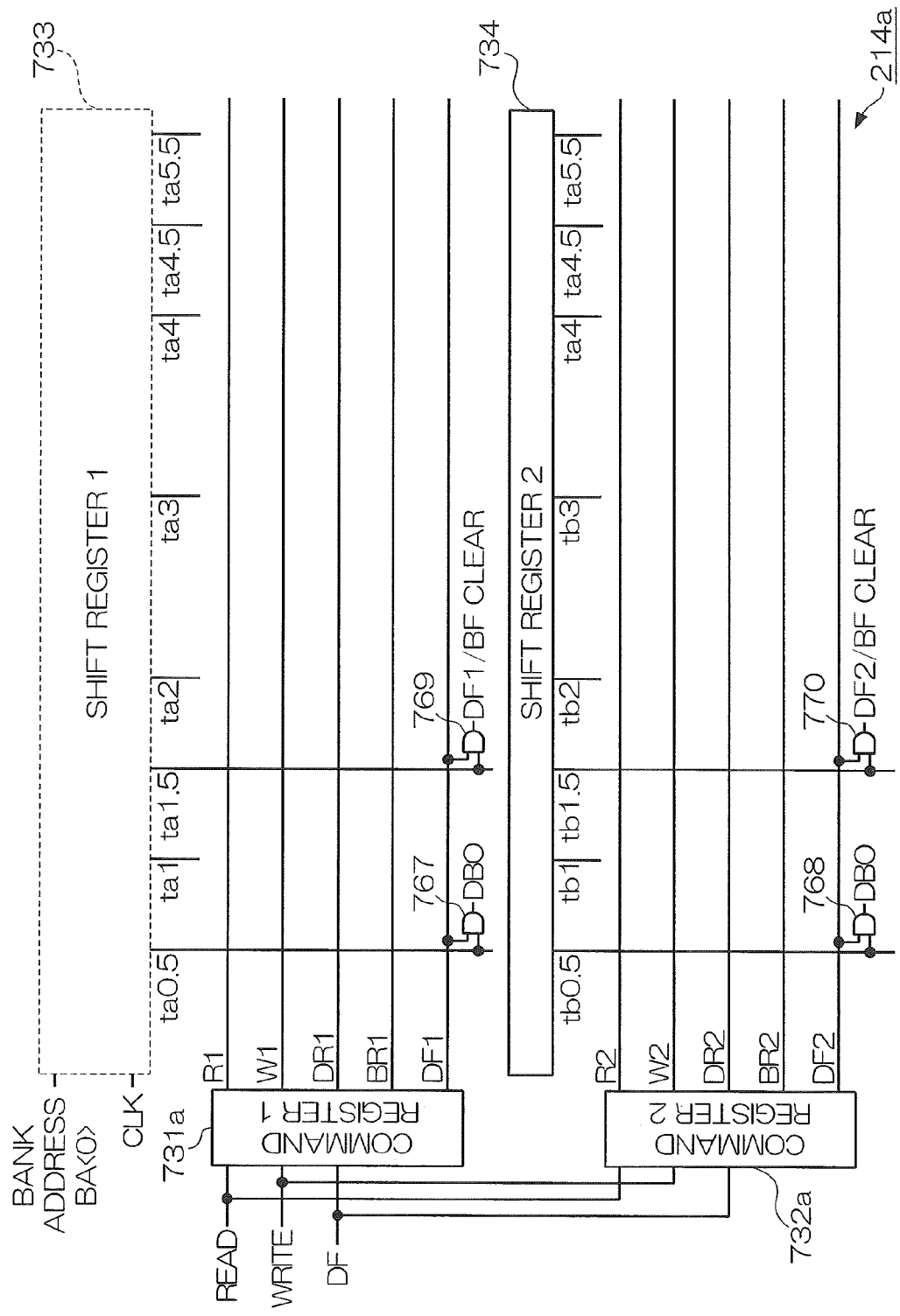
FIG. 24 is a diagram illustrating configurations of a second pipeline control circuit in the related art.

FIG. 24 shows a second pipeline control circuit to which a data flash command function is added. A pipeline control circuit 214*a* shown in FIG. 24 has a function of a partial configuration related to a data flash command function added to the pipeline control circuit 214 of FIG. 19 and is also a circuit having an additional configuration. The pipeline control circuit 214*a* of FIG. 24 has a command register 1 (731*a*) in which a function is added to the command register 1 (731), and a command register 2 (732*a*) in which a function is added to the command register 2 (732), in the pipeline control circuit 214 of FIG. 19, and also has additional AND circuits 767 and 770. In FIG. 24, the illustration of other parts shown in FIG. 19 is omitted, except for the above-described configuration, the shift register 1 (733), and the shift register 2 (734).

The signal DF1 is set when the DF signal is input, and is cleared when the DF1 clear signal, which is the output of the AND circuit 769, is input. The signal DF2 is set when the DF signal is input, and is cleared when the DF2 clear signal, which is an output of the AND circuit 770, is input. As in FIG. 19, the command registers 1 and 2 are alternately activated every time when the command is input, and either DF1 or DF2 is set if the DF signal is input. DF1 and the output ta0.5 of the shift register 1 are input to the AND circuit 767, and the DBO signal is output. DF2 and the output tb0.5 of the shift register 2 are input to the AND circuit 768, and the DBO signal is output. The DBO signal is a signal for outputting data of the delay buffer. DF1 and the output ta1.5 of the shift register 1 are input to the AND circuit 769, and the DF1/BF clear signal is output. DF2 and the output tb1.5 of the shift register 2 are input to the AND circuit 770, and the DF2/BF clear signal is output.

Figure 25:
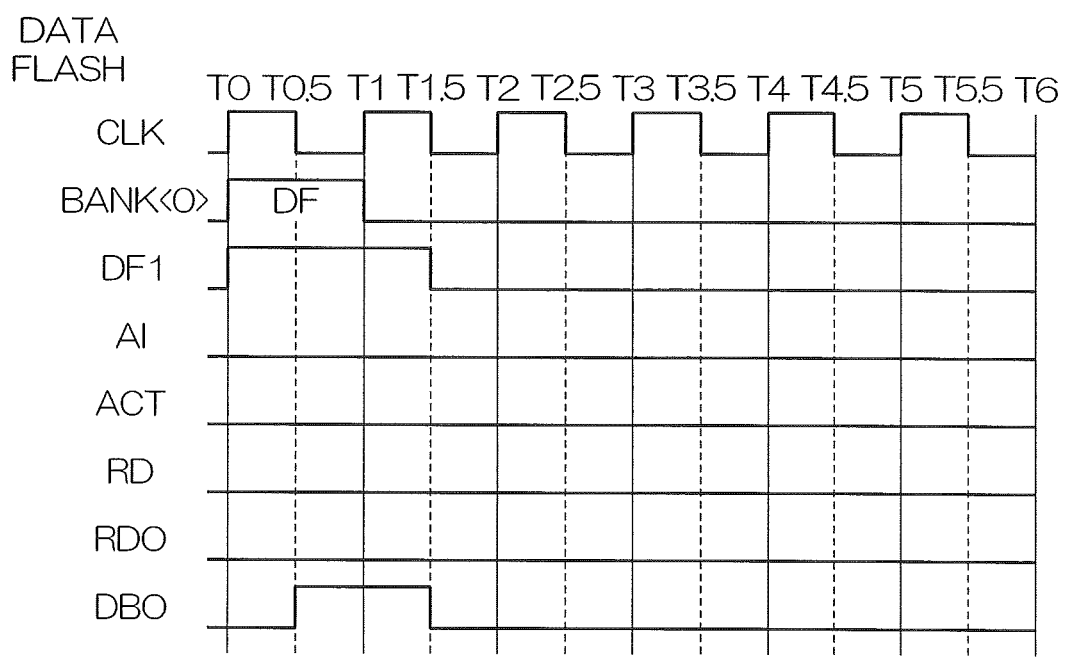
FIG. 25 is a timing chart illustrating timings of operations when a data flush signal is input into the second pipeline control circuit shown in FIG. 24.

FIG. 25 is a timing chart showing the operation waveforms of the pipeline control circuit 214*a* of FIG. 24 when a data flash command DF for the bank 0 is issued. There are shown the waveforms (or operation states) of the clock CLK, the data flash command DF for Bank<0>, the signal DF1, the signal AI, the signal ACT, the signal RD, the signal RDO, and the signal DBO. In FIG. 25, if the data flash command DF for Bank<0> is input in T0, the DF signal has the H level in the 1T period, so that the signal DF1 output from the command register 1 (731*a*) is set to have the H level. The signal DF1 is cleared to the L level by the DF1 clear signal output from the AND circuit 769 in T1.5. The signal DBO is output from the AND circuit 767 in a period of T0.5 to T1.5 by the signal DF1, which has the H level. Thereby, data within the delay buffer is output outside the chip by latency 1. In this period, the signals AI, ACT, RD, and RDO output by the read command are not output.

According to this embodiment, since Read Latency tAR=Write Latency tAW+Bank Operation Cycle tRC as shown in FIG. 10, each bank can perform read and write processing in a period of rRC without a gap.

In general, the frequency of random access to a memory is increased since a plurality of independent CPU cores perform calculations in the multi-core CPU shown in FIG. 1. Accordingly, the number of switching times of read/write may be increased. In an example of the related art, a bubble occurs each time, and an average data transmission rate is degraded. On the other hand, the present embodiment can shorten a clock cycle by pipelining, and can also prevent the degradation of the data transmission rate by suppressing the occurrence of the bubble.

Embodiments of the present invention are not limited thereto, and it is possible to appropriately make changes such as an increase/decrease of the number of DRAM cores MEM provided in the DRAM chip 1, an increase/decrease of the number of CPU cores CPU provided in the SoC chip 2, an increase/decrease of the number of banks in the DRAM core MEM, and the like.

Embodiments of the present invention can be considered as follows.

According to a first embodiment of the present invention, a semiconductor device includes a plurality of memory cores (the DRAM cores MEM0 to MEM15) on a single semiconductor board (the DRAM chip 1), wherein each of the memory cores includes a plurality of memory banks (the banks BANK0 to BANK8), a plurality of command terminals, a plurality of address terminals, a plurality of data terminals, a command decoder (the command decoder 213), which generates various control signals by decoding commands supplied from the plurality of command terminals, an address bus (the address bus ABUS), through which address information is transmitted from the plurality of address terminals, commonly provided in the plurality of memory banks, and a data read/write bus (the read/write bus RWBUS), through which data to be output to the plurality of data terminals is transmitted during a data read operation and data input from the plurality of data terminals is transmitted during a data write operation, commonly provided in all the plurality of memory banks, and performs the read/write operation for each memory core independent of each other. Each of the plurality of memory banks includes a memory array (the memory array (AR) 221) having a plurality of memory cells, and includes an address buffer (address delay buffer) (the address delay circuit 222), which receives address information on the address bus under control based on a control signal from the command decoder, a data output buffer (the data output latch 237), which temporarily retains data to be read onto the data read/write bus during the data read operation, a data input buffer (the data input latch 238), which temporarily retains data to be written on the data read/write bus during the data write operation, and an access circuit (the row decoder/column decoder 231, the main amplifier (MA) 233, the write driver (WD) 234, and the like), which accesses a memory cell selected in response to address information input to the address buffer, supplies the data to be read from the selected memory cell to the data output buffer during the data read operation, and supplies the data to be written from the data input buffer to the selected memory cell during the data write operation. Data access to the plurality of memory banks is pipelined so that a cycle is repeatedly executed by setting a series of data accesses of sequentially performing read or write access once for each of the plurality of memory banks as 1 cycle.

In the semiconductor device, each of the plurality of memory cores provided on the single semiconductor board includes the plurality of memory banks, the address bus and the data read/write bus commonly provided in the plurality of memory banks, the address buffer (address delay buffer), which receives address information on the address bus under control based on a control signal from the command decoder, the data output buffer, which temporarily retains data to be read onto the data read/write bus during the data read operation, and the data input buffer, which temporarily retains data to be written on the data read/write bus during the data write operation. According to this configuration, since the address information and the input/output data can be independently input and retained for each memory bank by control of each buffer, it is possible to independently easily control an address for each memory bank during the read and write operations. Since data access to the plurality of memory banks is pipelined so that a cycle is repeatedly executed by setting a series of data accesses of sequentially performing read or write access once for each of the plurality of memory banks as 1 cycle, it is easy to arbitrarily control an order of the read and write operations. Since the read/write operations on data for each memory core can be performed independently of each other, an effective data rate of a system can be easily increased.

According to a second embodiment, each of the plurality of memory banks further includes delay buffers (the delay buffers 0 to 3 (261 to 264)), which temporarily store data read on the basis of data read access, and permit transmission of data to be written to the data read/write bus via the plurality of data terminals on the basis of data write access, if data access to a predetermined memory bank in 1 cycle is the data read access and data access to a predetermined memory bank in the next 1 cycle is the data write access.

According to a third embodiment, a semiconductor device includes the pipeline control circuit 214, which retains read data on the read/write bus (RWBUS) 241 for each bank, retains the read data in the delay buffers 261 to 264, which delays and outputs the read data, and outputs write data serving as a target of a write command onto the read/write bus (RWBUS) 241, if the next command for the same bank is the write command when read data is output from the plurality of banks BANK0 to BANK3 having the memory array 221 in response to a read command by using the read/write bus (RWBUS) 241 commonly provided in the banks.

According to a fourth embodiment, the read/write bus (RWBUS) 241 is connected to each bank by time division in a pipeline operation.

According to a fifth embodiment, the banks BANK0 to BANK3 are connected to the read/write bus (RWBUS) 241 in every fixed cycle of a predetermined clock signal CLK (in every 4 CLK cycles).

A sixth embodiment includes the address delay circuit 222, which delays transmission of a read address on the address bus (ABUS) 215 connected to the banks 0 to 3 (BANK0 to BANK3) by write latency.

According to a seventh embodiment, an address setup time tAR before the read operation is a sum of an address setup time tAW before the write operation and a waiting time tRC upon access to the same bank.

According to an eighth embodiment, the pipeline control circuit 214 includes a pair of command registers 1 (731) and 2 (732), which alternately store each read or write command for the banks BANK0 to BANK3, and controls operations of the delay buffers 261 to 264 in response to a signal BF indicating whether the delay buffers 261 to 264 retain the read data and storage content (signals R1, W1, DR1, BR1, R2, W2, DR2, and BR2) of the pair of command registers 1 (731) and 2 (732).

According to a ninth embodiment, the pipeline control circuit 214 controls operations of the delay buffers 261 to 264 by using logic operation results (AND operations) using the AND circuit 751 and the like of a plurality of control signals (output signals of the flip-flops 711 to 715 and 721 to 725) in which an elapsed time after a command input to each of the banks BANK0 to BANK3 is indicated on the basis of a clock signal CLK, a signal BF indicating whether the delay buffers 261 to 264 retain the read data, and control signals (signals R1, W1, DR1, BR1, R2, W2, DR2, and BR2) representing storage content of the pair of command registers 1 (731) and 2 (732).

According to a tenth embodiment, the read/write bus (RWBUS) 241 performs write data transmission and read data transmission in first and second halves of the clock signal CLK.

According to an eleventh embodiment, the plurality of banks BANK0 to BANK3 are included in memory cores (the DRAM cores MEM0 to MEM15) in a memory chip (the DRAM chip 1) having a plurality of memory cores DRAM cores MEM. The memory chip (the DRAM chip 1) and a CPU chip (the SoC chip 1), which is stacked with the memory chip and has a plurality of CPU cores (the CPU cores CPU), are included therein.

According to a twelfth embodiment, the command address input circuit 211, which receive a command and an address, the address bus (ABUS) 215, the banks BANK0 to BANK3, the read/write bus (RWBUS) 241, and the data I/O circuit (DQ) 273, which inputs and outputs data onto the read/write bus, are respectively separated by the latch circuits (L) 101 to 110 to be controlled by the clock signal CLK.

According to a thirteenth embodiment, a latch circuit (the data latch circuit 251), which separates the read/write bus (RWBUS) 241 and the data I/O circuit (DQ) 273, includes the delay buffers 261 to 264 of each bank, the output latch 265, which retains read data, and the input latch 266, which retains write data.

According to a fourteenth embodiment, row and column addresses are simultaneously supplied to the banks BANK0 to BANK3 via the address bus (ABUS) 215.

According to a fifteenth embodiment, the 32:1 MUX 271 and the 1:32 DMUX 272 are provided between the read/write bus (RWBUS) 241 and the data I/O circuit 273.

According to a sixteenth embodiment, data is input/output between the memory cores and the CPU cores (between the DRAM cores MEM0 to MEM15 and the CPU cores CPU0 to CPU15) in synchronization with a read/write clock signal RWCLK having a cycle, which is shorter than that of the clock signal CLK.

According to a seventeenth embodiment, the number of memory cores (the DRAM cores MEM0 to MEM15) is the same as the number of CPU cores (the CPU cores CPU0 to CPU15), and the memory cores and the CPU cores are arranged in positions corresponding to each other on the chips.

According to the second to sixteenth embodiments of the present invention, since the read data can be retained, delayed, and output using the delay buffer when the write command is input, it is possible to input/output the read command, the write command, the read data, and the write data in a fixed cycle allocated to each bank without a collision if a pipeline operation is performed. Consequently, it is possible to easily improve usability and an effective data rate in access to a semiconductor memory as compared with the related art.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method for carrying out read and write operations in a synchronous memory device having a shared I/O, the method comprising:
    receiving a read command directed to a first internal memory bank during a first timeslot;
    activating the first internal memory bank to access read data at a read address requested by the read command;
    receiving a write command directed to a second internal memory bank during a second timeslot later than the first timeslot;
    determining whether a data collision between the read data for output to the shared I/O with normal read latency and write data to be received on the shared I/O with normal write latency would occur;
    receiving the write data on the shared I/O with the normal write latency during a third timeslot later than the second timeslot;
    outputting, if it was determined that the data collision would not occur, the read data with the normal read latency on the shared I/O during a fourth timeslot;
    activating the second internal memory bank to write the write data to a write address requested by the write command; and
    outputting, if it was determined that the data collision would occur, the read data with read latency greater than the normal read latency to the shared I/O during a fifth timeslot later than the third timeslot.

2. The method as claimed in claim 1, wherein the fourth timeslot is later than the third timeslot.

3. The method as claimed in claim 1, wherein the fourth timeslot is earlier than the third timeslot.

4. The method as claimed in claim 1, wherein each of the first to fifth timeslots have a duration of one clock period.

5. The method as claimed in claim 1, wherein the normal read latency is equal to the sum of the normal write latency plus a bank waiting time.

6. The method as claimed in claim 1, wherein the read and write commands are pipelined.

7. The method as claimed in claim 6, wherein the first and second internal memory banks are sequentially accessed.

8. The method as claimed in claim 7, wherein the read latency greater than the normal read latency is equal to the normal read latency plus a bank waiting time.

9. The method as claimed in claim 1, wherein the read and write data are transferred between the first and second internal memory banks and the shared I/O over a shared read/write bus.

10. The method as claimed in claim 9, wherein the read and write data are transferred over the shared read/write bus during a common timeslot, the read data being transferred over the shared read/write bus during one half of the common timeslot and the write data being transferred over the shared read/write bus during the other one half of the common timeslot.

11. The method as claimed in claim 1, wherein the synchronous memory device is a DRAM.

12. The method as claimed in claim 11, wherein the synchronous memory device is a 2T DRAM.

13. The method as claimed in claim 1, wherein the synchronous memory device is a stacked memory device.

14. The method as claimed in claim 1, wherein each of the first to fifth timeslots have a duration of not more than one clock period.

* * * * *